(12) United States Patent
Wang et al.

(10) Patent No.: US 12,164,235 B2
(45) Date of Patent: *Dec. 10, 2024

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Shao-Hua Wang, Taoyuan (TW); Kueilin Ho, Hsinchu (TW); Cheng Wei Sun, Hsinchu (TW); Zong-You Yang, Hsinchu (TW); Chih-Chun Chiang, Miaoli (TW); Yi-Fam Shiu, Toufen (TW); Chueh-Chi Kuo, Kaohsiung (TW); Heng-Hsin Liu, New Taipei (TW); Li-Jui Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,135

(22) Filed: Jul. 31, 2023

(65) Prior Publication Data

US 2023/0375947 A1    Nov. 23, 2023

Related U.S. Application Data

(63) Continuation of application No. 17/662,908, filed on May 11, 2022, now Pat. No. 11,803,129.
(Continued)

(51) Int. Cl.
G03F 7/00    (2006.01)

(52) U.S. Cl.
CPC ...... *G03F 7/70858* (2013.01); *G03F 7/70033* (2013.01); *G03F 7/70841* (2013.01); *G03F 7/70916* (2013.01)

(58) Field of Classification Search
CPC .......... G03F 7/70858; G03F 7/70033; G03F 7/70841; G03F 7/70525; G03F 7/7075;
(Continued)

(56) References Cited

U.S. PATENT DOCUMENTS

| 5,128,975 A | 7/1992 | Iwamoto et al. |
| RE38,318 E | 11/2003 | Brenes |

(Continued)

FOREIGN PATENT DOCUMENTS

JP    2009115242 A  *  5/2009  .............. F16K 3/32

OTHER PUBLICATIONS

English translation of JP-2009115242-A (Year: 2009).*

*Primary Examiner* — Christina A Riddle
(74) *Attorney, Agent, or Firm* — Harrity & Harrity, LLP

(57) ABSTRACT

Some implementations described herein include operating components in a lithography system at variable speeds to reduce, minimize, and/or prevent particle generation due to rubbing of or collision between contact parts of the components. In some implementations, a component in a path of transfer of a semiconductor substrate in the lithography system is operated at a relatively high movement speed through a first portion of an actuation operation, and is operated at a reduced movement speed (e.g., a movement speed that is less than the high movement speed) through a second portion of the actuation operation in which contact parts of the component are to interact. The reduced movement speed reduces the likelihood of particle generation and/or release from the contact parts when the contact parts interact, while the high movement speed provides a high semiconductor substrate throughput in the lithography system.

20 Claims, 18 Drawing Sheets

Related U.S. Application Data

(60) Provisional application No. 63/260,253, filed on Aug. 13, 2021.

(58) Field of Classification Search
CPC .................. G03F 7/70916; G03F 7/70; G03F 7/70483–70541; G03F 7/708; G03F 7/70808; G03F 7/70816; G03F 7/70825; G03F 7/70883; G03F 7/709; G03F 7/70908–70933; G03F 7/7095; G03F 7/70975; G03F 7/70991; F16K 3/00–36; G06N 20/00; H05G 2/00–008; H01L 21/67201; H01L 21/67126; H01L 21/67225
USPC ..................... 355/18, 30, 52–55, 67–77, 133
See application file for complete search history.

(56) References Cited

U.S. PATENT DOCUMENTS

| | | | |
|---|---|---|---|
| 6,842,221 | B1 | 1/2005 | Shiraishi |
| 11,803,129 | B2 * | 10/2023 | Wang .................. G03F 7/70916 |
| 2017/0186633 | A1 | 6/2017 | Kamiya |
| 2019/0331257 | A1 | 10/2019 | Nagai et al. |
| 2022/0075281 | A1 | 3/2022 | Do |
| 2023/0046032 | A1 | 2/2023 | Wang et al. |

* cited by examiner

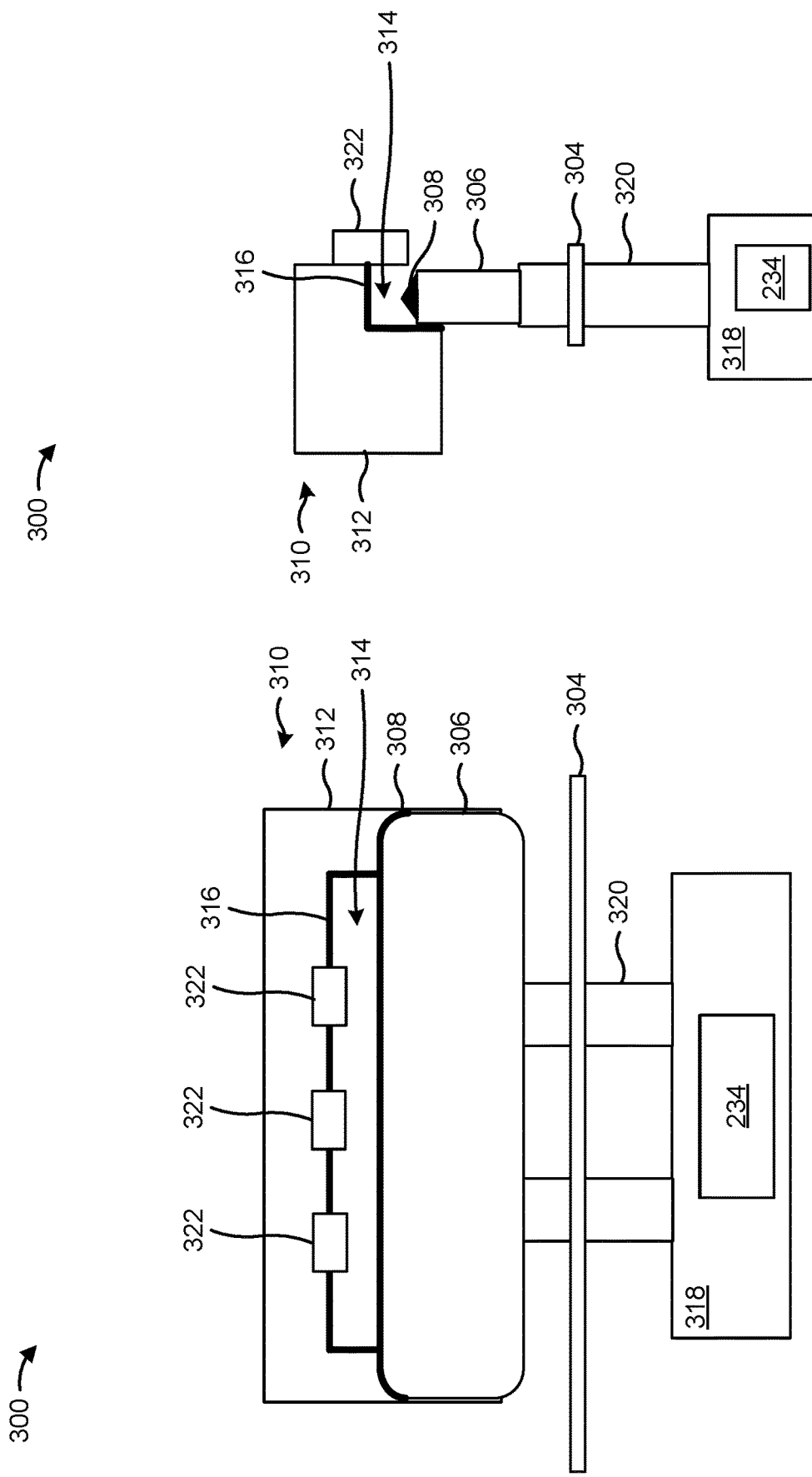

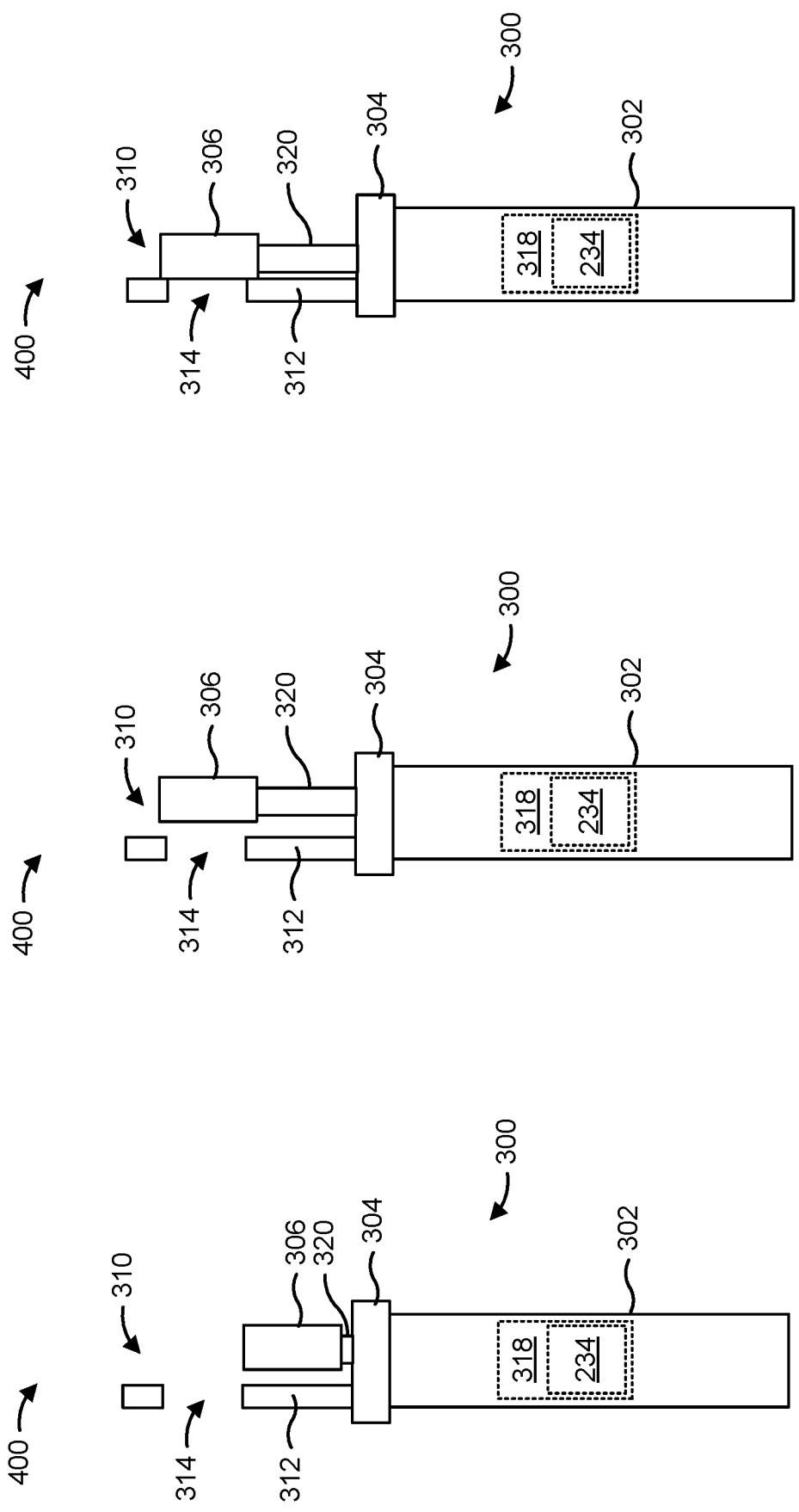

SEMICONDUCTOR PROCESSING TOOL AND METHODS OF OPERATION

CROSS-REFERENCE TO RELATED APPLICATION

This application is a continuation of U.S. patent application Ser. No. 17/662,908, filed May 11, 2022, entitled "SEMICONDUCTOR PROCESSING TOOL AND METHODS OF OPERATION," which claims priority to U.S. Provisional Patent Application No. 63/260,253, filed on Aug. 13, 2021, entitled "SEMICONDUCTOR PROCESSING TOOL AND METHODS OF OPERATION" the contents of which are incorporated herein by reference in their entireties.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are diagrams of an example gate valve system described herein.

FIGS. 4A-4C, 5A, and 5B are diagrams of an example implementation described herein.

DETAILED DESCRIPTION

Figure 1:
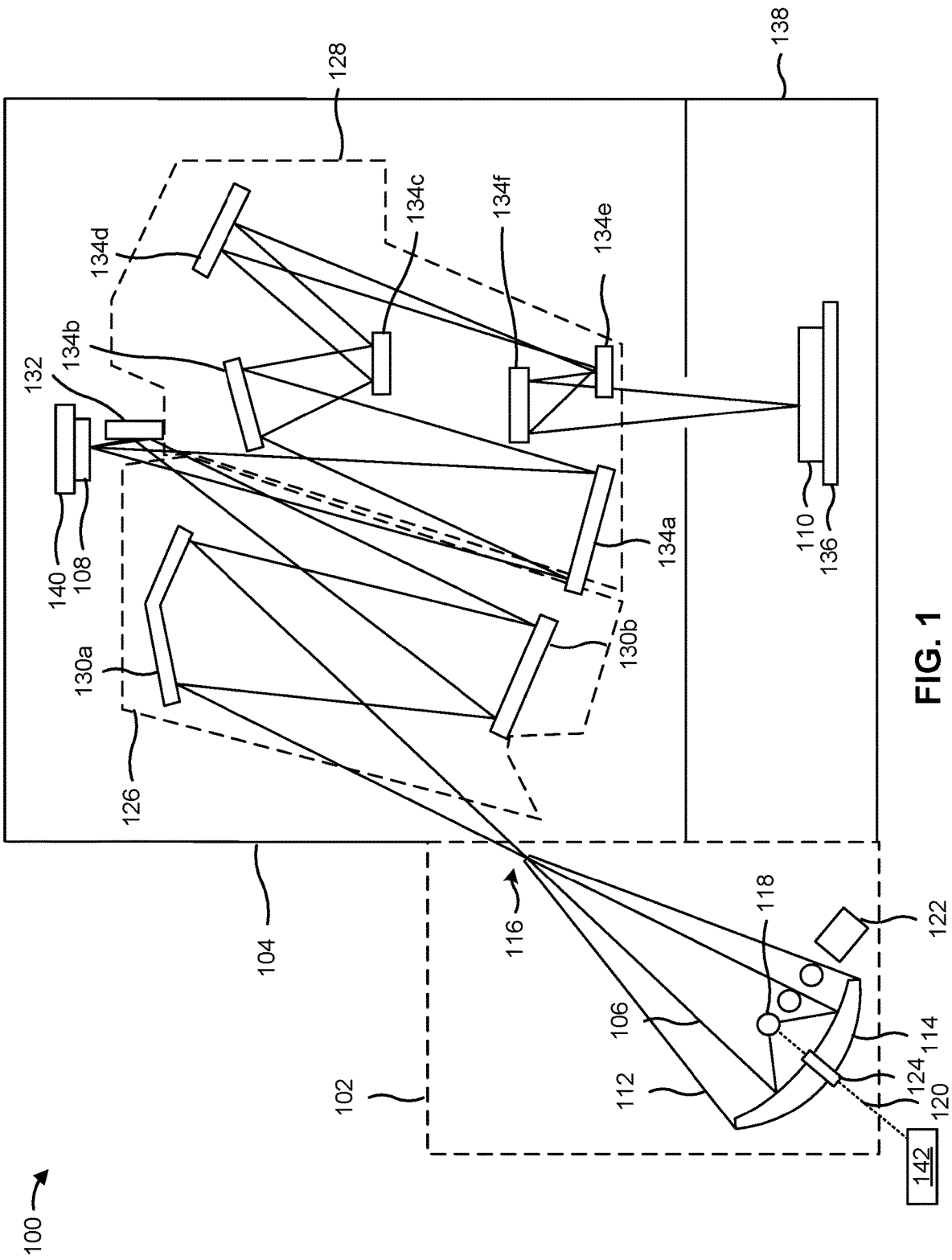
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Maintaining a high movement speed of components in a lithography system (e.g., an extreme ultraviolet (EUV) lithography system, an exposure tool, an EUV scanner) increases the rate of transfer of semiconductor substrates in the lithography system, which enables increased throughput of the lithography system to be achieved. However, high movement speed results in high momentum of contact parts of the components, which can cause high wearing or damage to the contact parts and/or to the semiconductor substrates.

Numerous components in the lithography system can generate and/or release particles due to rubbing of or collision between contact parts of the components. Particle generation and/or release can occur at various locations along a path of transfer of a semiconductor substrate in the lithography system, such as a path of transfer between a transport carrier and a wafer stage of the lithography system. As a result, the semiconductor substrate may suffer from particle fall-on (e.g., the landing of particles on the semiconductor substrate), which may cause semiconductor substrate defects on the semiconductor substrate, semiconductor device failures on the semiconductor substrate, and/or semiconductor yield loss for the semiconductor substrate, among other examples. Moreover, to remove particles from the lithography system, a cleaning frequency of the components in the path of transfer for the semiconductor substrate may result in increased downtime of the lithography system, which reduces productivity and throughput of the lithography system. Further, the rubbing of or collision between contact parts of the components of the lithography system can result in an increase in parts replacement, which increases the complexity and cost of maintaining the lithography system.

Some implementations described herein provide techniques and apparatuses for operating components in a lithography system (e.g., an EUV lithography system or another type of lithography system) at variable speeds to reduce, minimize, and/or prevent particle generation due to rubbing of or collision between contact parts of the components. In some implementations, a component (e.g., a gate valve system, a pre-aligner pin, a wafer stage chuck pin) in a path of transfer of a semiconductor substrate in the lithography system is operated at a relatively high movement speed through a first portion of an actuation operation, and is operated at a reduced movement speed (e.g., a movement speed that is less than the high movement speed) through a second portion of the actuation operation in which contact parts of the component are to interact. The reduced movement speed reduces the likelihood of particle generation and/or release from the contact parts when the contact parts interact, while the high movement speed provides a high semiconductor substrate throughput in the lithography system.

In this way, the variable speed operation of one or more components in the lithography system described herein may reduce friction between the contact parts and/or may reduce forces applied to the contact parts, which reduces the likelihood of particle generation in the lithography system. Example implementations described herein may reduce wearing and wafer particle fall-on (e.g., from approximately 1.5 average particles to approximately 0.5 average particles per semiconductor substrate or fewer), which reduces semiconductor substrate defects on the semiconductor substrate, reduces semiconductor device failures on the semiconductor substrate, and/or increases semiconductor yield for the semiconductor substrate, among other examples. Moreover, example implementations described herein may reduce the cleaning frequency (e.g., may increase the time duration between cleaning operations) of components in one or more paths of transfer of semiconductor substrates in the lithography system (e.g., by 50% or more), which increases the available time (e.g., the time duration that the lithography system is in production operation) and throughput of the lithography system. In addition, example implementations described herein may reduce the replacement frequency (e.g., may increase the time duration between component replacement) of components in one or more paths of transfer of semiconductor substrates in the lithography systems (e.g., from approximately 5 weeks between component replacement to approximately 12 weeks or greater between component replacement), which reduces the complexity and cost of maintaining the lithography system.

FIG. 1 is a diagram of an example lithography system 100 described herein. The lithography system 100 includes an EUV lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner tool, and EUV exposure tool, or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 of a target material (e.g., droplets of a target material including Sn droplets or another type of droplets) of a target material being exposed to a laser beam 120. The droplets 118 are provided across the front of the collector 114 by a droplet generator (DG) 122. The droplet generator 122 is pressurized to provide a fine and controlled output of the droplets 118. The laser beam 120 is provided such that the laser beam 120 is focused through a window 124 of the collector 114. The laser beam 120 is focused onto the droplets 118 which generates the plasma. The plasma produces a plasma emission, some of which is the radiation 106.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a wafer stage 136 (or a substrate stage) configured to support the semiconductor substrate 110. Moreover, the wafer stage 136 is configured to move (or step) the semiconductor substrate 110 through a plurality of exposure fields as the radiation 106 transfers the pattern from the reticle 108 onto the semiconductor substrate 110. The wafer stage 136 is included in a bottom module 138 of the exposure tool 104. The bottom module 138 includes a removable subsystem of the exposure tool 104. The bottom module 138 may slide out of the exposure tool 104 and/or otherwise may be removed from the exposure tool 104 to enable cleaning and inspection of the wafer stage 136 and/or the components of the wafer stage 136. The bottom module 138 isolates the wafer stage 136 from other areas in the exposure tool 104 to reduce and/or minimize contamination of the semiconductor substrate 110. Moreover, the bottom module 138 may provide physical isolation for the wafer stage 136 by reducing the transfer of vibrations (e.g., vibrations in the semiconductor processing environment in which the lithography system 100 is located, vibrations in the lithography system 100 during operation of the lithography system 100) to the wafer stage 136 and, therefore, the semiconductor substrate 110. This reduces movement and/or disturbance of the semiconductor substrate 110, which reduces the likelihood that the vibrations may cause a pattern misalignment.

The exposure tool 104 also includes a reticle stage 140 that is configured to support and/or secure the reticle 108. Moreover, the reticle stage 140 is configured to move or slide the reticle through the radiation 106 such that the reticle 108 is scanned by the radiation 106. In this way, a pattern that is larger than the field or beam of the radiation 106 may be transferred to the semiconductor substrate 110.

The lithography system 100 includes a laser source 142. The laser source 142 is configured to generate the laser beam 120. The laser source 142 may include a CO2-based laser source or another type of laser source. Due to the wavelength of the laser beams generated by a CO2-based laser source in an infrared (IR) region, the laser beams may be highly absorbed by tin, which enables the CO2-based laser source to achieve high power and energy for pumping tin-based plasma. In some implementations, the laser beam 120 includes a plurality of types of laser beams that the laser source 142 generates using a multi-pulse technique (or a multi-stage pumping technique), in which the laser source 142 generates a pre-pulse laser beam and main-pulse laser beam to achieve greater heating efficiency of tin (Sn)-based plasma to increase conversion efficiency.

In an example exposure operation (e.g., an EUV exposure operation), the droplet generator 122 provides the stream of the droplets 118 across the front of the collector 114. The laser beam 120 contacts the droplets 118, which causes a plasma to be generated. The laser source 142 generates and provides a pre-pulse laser beam toward a target material droplet in the stream of the droplets 118, and the pre-pulse laser beam is absorbed by the target material droplet. This transforms the target material droplet into disc shape or a mist. Subsequently, the laser source 142 provides a main-pulse laser beam with large intensity and energy toward the disc-shaped target material or target material mist. Here, the atoms of the target material are neutralized, and ions are generated through thermal flux and shock wave. The main-pulse laser beam pumps ions to a higher charge state, which causes the ions to radiate the radiation 106 (e.g., EUV light).

The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2A:
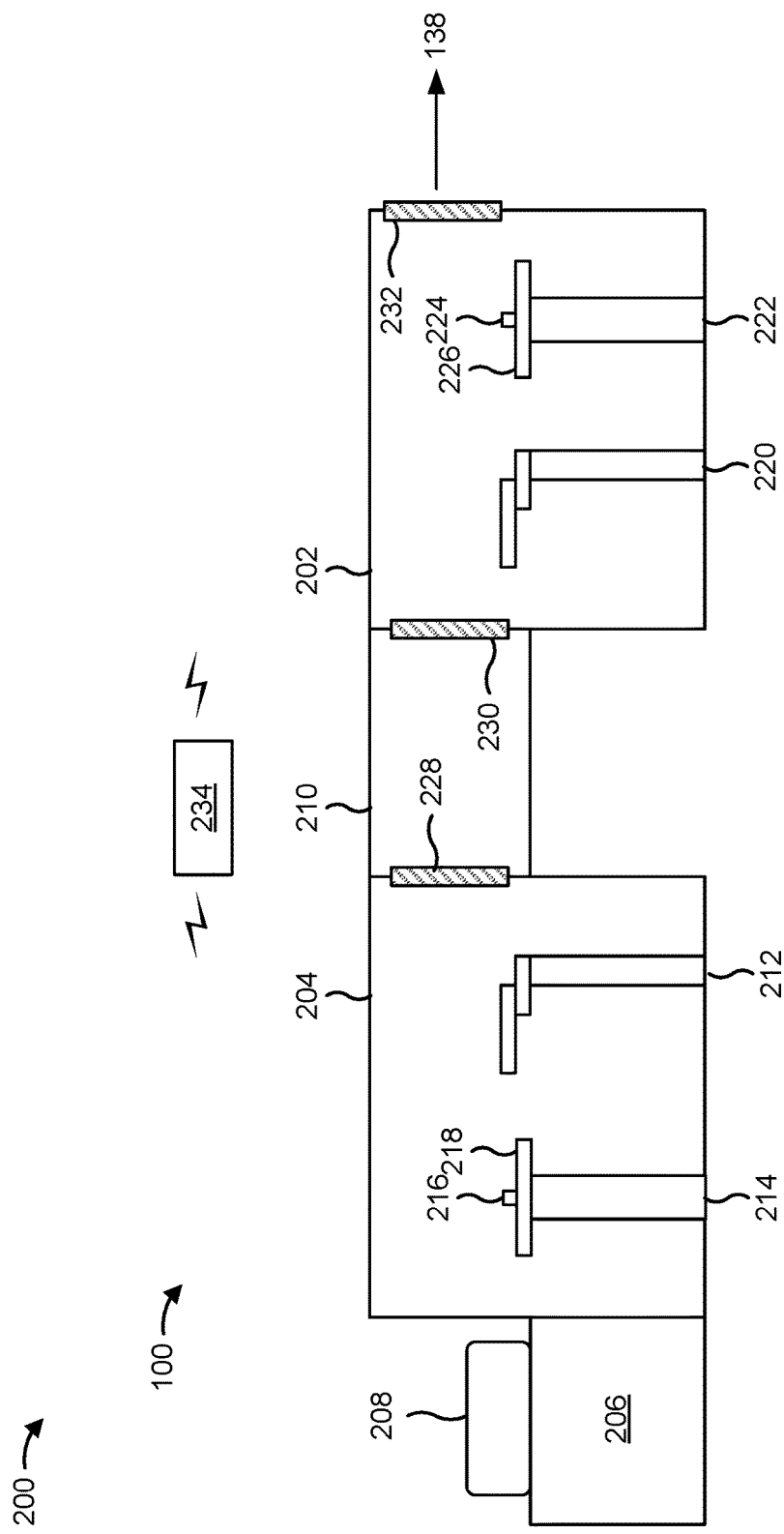
FIGS. 2A and 2B are diagrams of an example implementation described herein.
Figure 2B:
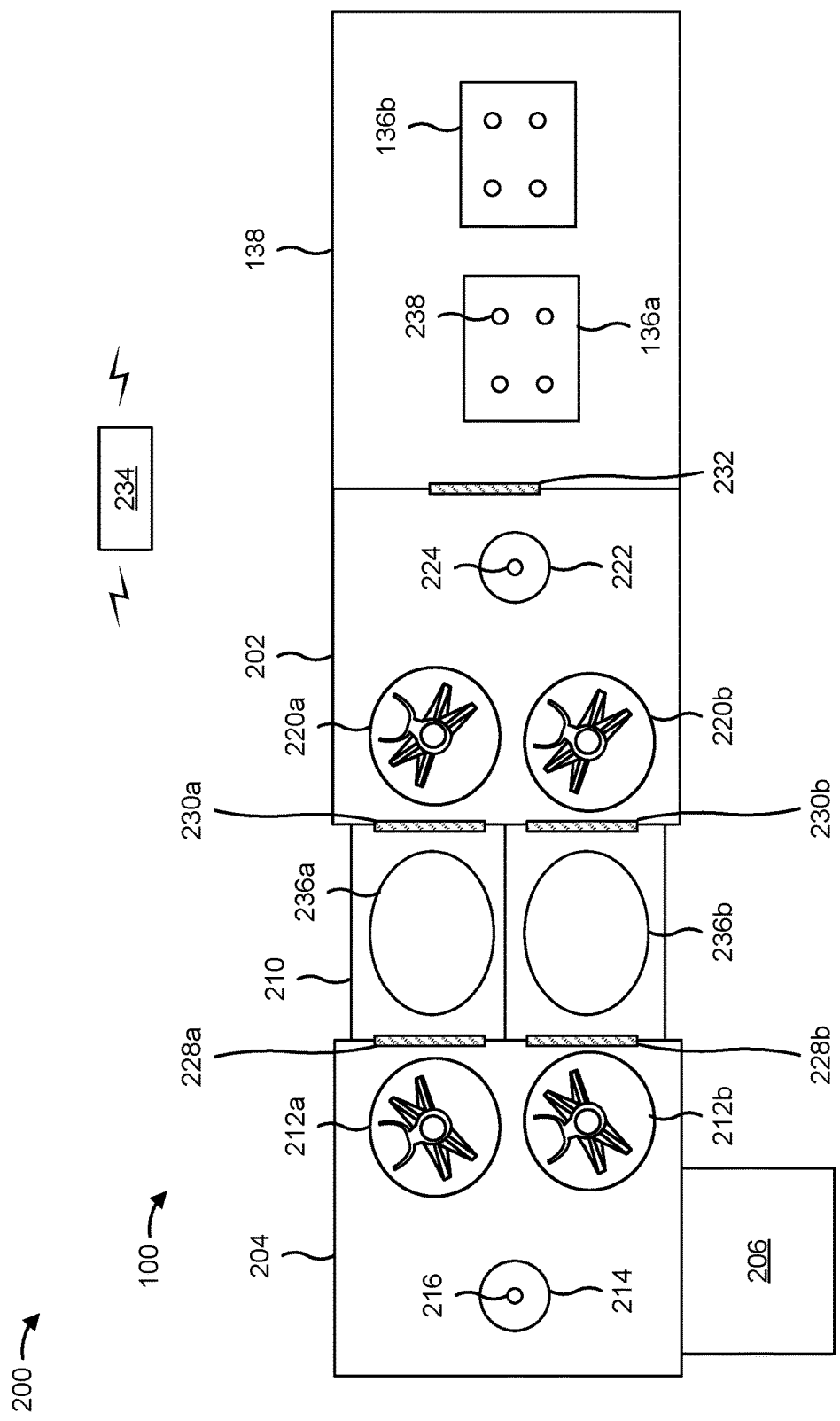

FIGS. 2A and 2B are diagrams of an example implementation 200 described herein. The example implementation 200 includes an example of one or more paths of transfer of semiconductor substrates 110 in a lithography system (e.g., an EUV lithography system) such as the lithography system 100 of FIG. 1. FIG. 2A illustrates a cross-sectional elevation view of a plurality of components in the one or more paths of transfer. FIG. 2B illustrates a top-down (or plan) view of the plurality of components in the one or more paths of transfer. The plurality of components in the one or more paths of transfer are configured to transport semiconductor substrates 110 to and/or from the wafer stage 136.

As shown in FIG. 2A, the lithography system 100 includes a vacuum chamber 202 and an atmospheric chamber 204. The vacuum chamber 202 includes a chamber of the lithography system 100 that is pressurized to a vacuum (or a partial vacuum) to support generating and maintaining of the radiation 106 (e.g., EUV radiation). In some implementations, the vacuum chamber 202 and the bottom module 138 are pressurized together such that the vacuum chamber 202 and the bottom module 138 are a continuous and homogenous environment.

The atmospheric chamber 204 includes a chamber of the lithography system 100 that is maintained at or near atmospheric pressure (e.g., at or near the atmospheric pressure of the environment in which the lithography system 100 is located). A load port 206 is located adjacent to the atmospheric chamber 204. The load port 206 includes a component on which a transport carrier 208 may be positioned and/or supported. The load port 206 is configured to receive the transport carrier 208 from and/or provide the transport carrier 208 to a transport tool such as an overhead hoist transport (OHT) system or another type of transport tool. The load port 206 may also be configured to circulate a gas through the transport carrier 208 to maintain an environment in the transport carrier 208. The transport carrier 208 includes a wafer cassette, a front-opening unified pod (FOUP), a pod, a container, or a similar type of device that is configured to enable the transport of semiconductor substrates 110 a reticle 108 and is configured to protect the semiconductor substrates 110 from contamination and/or physical damage during transport and/or storage.

A load lock chamber 210 is included between the vacuum chamber 202 and the atmospheric chamber 204. The load lock chamber 210 includes a chamber that is configured to permit the transfer of semiconductor substrates 110 between the vacuum chamber 202 and the atmospheric chamber 204 while maintaining environmental isolation between the vacuum chamber 202 and the atmospheric chamber 204. This reduces cross-contamination between the vacuum chamber 202 and the atmospheric chamber 204, and reduces the likelihood of the transfer of contaminants from the environment in which the lithography system 100 is located to the bottom module 138 (which may result in defect formation on one or more semiconductor substrates 110 during operation of the lithography system 100).

A transport tool 212 is located in the atmospheric chamber 204 and is configured to transfer semiconductor substrates 110 between the transport carrier 208 on the load port 206 and the load lock chamber 210. The transport tool 212 may include a robotic arm, a wafer transport robot, or another type of tool that is configured to transport semiconductor substrates 110 between the transport carrier 208 and the load lock chamber 210 through the atmospheric chamber 204.

A pre-alignment component 214 is included in the atmospheric chamber 204. The transport tool 212 is configured to use the pre-alignment component 214 to align semiconductor substrates 110 in a consistent and predictable manner, which increases repeatability and quality control for the lithography system 100. To use the pre-alignment component 214, the transport tool 212 may obtain a semiconductor substrate 110 (e.g., from the transport carrier 208, from the load lock chamber 210) and may place the semiconductor substrate 110 on a lift pin 216 of the pre-alignment component 214. The pre-alignment component 214 retracts the lift pin 216 (e.g., using an electromechanical motor, a pneumatic control system, or another type of control system) to lower the semiconductor substrate 110 onto a platform 218. The pre-alignment component 214 then rotates the semiconductor substrate 110 on the platform 218 to position the semiconductor substrate 110 in a particular orientation. For example, the pre-alignment component 214 may rotate the semiconductor substrate 110 to position a notch of the semiconductor substrate 110 in a particular location. The pre-alignment component 214 may then extend the lift pin 216 to raise or lift the semiconductor substrate 110 off of the platform 218, which permits the transport tool 212 to retrieve the semiconductor substrate 110 from the pre-alignment component 214. In some implementations, the transport tool 212 uses the pre-alignment component 214 to position a semiconductor substrate 110 in a particular orientation prior to transferring the semiconductor substrate 110 to the load lock chamber 210. In some implementations, the transport tool 212 uses the pre-alignment component 214 to position a semiconductor substrate 110 in a particular orientation prior to transferring the semiconductor substrate 110 to the transport carrier 208.

A transport tool 220 is located in the vacuum chamber 202 and is configured to transfer semiconductor substrates 110 between the load lock chamber 210 and the bottom module 138. The transport tool 220 may include a robotic arm, a wafer transport robot, or another type of tool that is configured to transport semiconductor substrates 110 between the load lock chamber 210 and the bottom module 138 through the vacuum chamber 202.

A pre-alignment component 222 is included in the vacuum chamber 202. The transport tool 220 is configured to use the pre-alignment component 222 to align semiconductor substrates 110 in a consistent and predictable manner, which increases repeatability and quality control for the lithography system 100. To use the pre-alignment component 222, the transport tool 220 may obtain a semiconductor substrate 110 (e.g., from the load lock chamber 210, from the bottom module 138) and may place the semiconductor substrate 110 on a lift pin 224 of the pre-alignment component 222. The pre-alignment component 222 retracts the lift pin 224 (e.g., using an electromechanical motor, a pneumatic control system, or another type of control system) to lower the semiconductor substrate 110 onto a platform 226. The pre-alignment component 222 then rotates the semiconductor substrate 110 on the platform 226 to position the semiconductor substrate 110 in a particular orientation. For example, the pre-alignment component 222 may rotate the semiconductor substrate 110 to position a notch of the semiconductor substrate 110 in a particular location. The pre-alignment component 222 may then extend the lift pin 224 to raise or lift the semiconductor substrate 110 off of the platform 226, which permits the transport tool 220 to retrieve the semiconductor substrate 110 from the pre-alignment component 222. In some implementations, the transport tool 220 uses the pre-alignment component 222 to position a semiconductor substrate 110 in a particular orientation prior to transferring the semiconductor substrate 110 to the load lock chamber 210. In some implementations, the transport tool 220 uses the pre-alignment component 222 to position a semiconductor substrate 110 in a particular orientation prior to transferring the semiconductor substrate 110 to the bottom module 138.

As further shown in FIG. 2A, the lithography system 100 may include one or more doors. A door may selectively separate and/or isolate chambers or areas of the lithography system 100. For example, a door 228 between the atmospheric chamber 204 and the load lock chamber 210 may provide environmental isolation between the atmospheric chamber 204 and the load lock chamber 210. As another example, a door 230 between the vacuum chamber 202 and the load lock chamber 210 may provide environmental isolation between the vacuum chamber 202 and the load lock chamber 210. As another example, a door 232 between the vacuum chamber 202 and the bottom module 138 may provide environmental isolation between the vacuum chamber 202 and the bottom module 138.

A door (e.g., the door 228, the door 230, the door 232) may be actuated to provide access between chambers or areas of the lithography system 100. For example, the door 228 may be actuated to provide access to the load lock chamber 210 from the atmospheric chamber 204. As another example, the door 230 may be actuated to provide access to the load lock chamber 210 from the vacuum chamber 202. As another example, the door 232 may be actuated to provide access to the bottom module 138 from the vacuum chamber 202.

As further shown in FIG. 2A, the lithography system 100 may include a controller 234 that is communicatively connected to various components of the lithography system 100. The controller 234 may provide signals to one or more components of the lithography system 100 to initiate and/or facilitate the transfer of a semiconductor substrate 110 along a path of transfer for the semiconductor substrate 110. A path of transfer may include, for example, transfer from the transport carrier 208 to the atmospheric chamber 204, from the atmospheric chamber 204 to the load lock chamber 210, from the load lock chamber 210 to the vacuum chamber 202, and/or from the vacuum chamber 202 to the bottom module 138. As another example, a path of transfer may include transfer from the bottom module 138 to the vacuum chamber 202, from the vacuum chamber 202 to the load lock chamber 210, from the load lock chamber 210 to the atmospheric chamber 204, and/or from the atmospheric chamber 204 to the transport carrier 208.

Accordingly, the transport tool 212, the pre-alignment component 214, the transport tool 220, the pre-alignment component 222, the door 228, the door 230, and/or the door 232 may be included in a path of transfer of a semiconductor substrate 110. The controller 234 may transmit or provide one or more signals to the transport tool 212, the pre-alignment component 214, the transport tool 220, the pre-alignment component 222, the door 228, the door 230, and/or the door 232 to cause the transport tool 212, the pre-alignment component 214, the transport tool 220, the pre-alignment component 222, the door 228, the door 230, and/or the door 232 to transfer (or to permit the transfer of) a semiconductor substrate 110 in the lithography system 100 along a path of transfer. For example, the controller 234 may provide one or more signals to the transport tool 212 and/or to the transport tool 220 to cause the transport tool 212 and/or to the transport tool 220 to retrieve and/or provide a semiconductor substrate 110. As another example, the controller 234 may provide one or more signals to the pre-alignment component 214 and/or to the pre-alignment component 222 to cause the pre-alignment component 214 and/or to the pre-alignment component 222 to position a semiconductor substrate 110 in a particular orientation. As another example, the controller 234 may provide one or more signals to a door (e.g., the door 228, the door 230, the door 232) to cause the door to open or to cause the door to close.

The controller 234 is configured to transmit one or more types of signals to one or more components of the lithography system 100. The signals include analog signals, digital signals, or a combination thereof. The signals include voltages, currents, digital communications (e.g., packets), and/or other types of signals. In some implementations, the lithography system 100 includes a plurality of controllers 234. In some implementations, one or more components of the lithography system 100 include one or more controllers 234. For example, a control system for the transport tool 212 may include one or more controllers 234, and/or a control system for the transport tool 220 may include one or more controllers 234. As another example, a control system for the pre-alignment component 214 may include one or more controllers 234, and/or a control system for the pre-alignment component 222 may include one or more controllers 234. As another example, a control system for the door 228 may include one or more controllers 234, a control system for the door 230 may include one or more controllers 234, and/or a control system for the door 232 may include one or more controllers 234.

As shown in the top-down view in FIG. 2B, the atmospheric chamber 204 may include a plurality of transport tools 212, including a transport tool 212a and a transport tool 212b. The vacuum chamber 202 may include a plurality of transport tools 220, including a transport tool 220a and a transport tool 220b. The load lock chamber 210 may include a plurality of sub-chambers, including a sub-chamber 236a and a sub-chamber 236b. The bottom module 138 may include a plurality of wafer stages 136, including a wafer stage 136a and a wafer stage 136b. In some implementations, the lithography system 100 includes different quantities of transport tools 212, transport tools 220, sub-chambers 236, and/or wafer stages 136 than the quantities shown in FIG. 2B.

The sub-chamber 236a and the sub-chamber 236b are environmentally isolated and permit two-way transfer of semiconductor substrates 110. For example, the sub-chamber 236a may be configured to provide a first path of transfer of semiconductor substrates 110 from the transport carrier 208 to the bottom module 138, and the sub-chamber 236b may be configured to provide a second path of transfer of semiconductor substrates 110 from the bottom module 138 to the transport carrier 208. This further reduces cross-contamination between the vacuum chamber 202 and the atmospheric chamber 204, and increases throughput in the lithography system 100 by enabling simultaneous two-way transfer of semiconductor substrates 110 through the load lock chamber 210. A door 228a may be positioned between the sub-chamber 236a and the atmospheric chamber 204, a door 228b may be positioned between the sub-chamber 236b and the atmospheric chamber 204, a door 230a may be positioned between the sub-chamber 236a and the vacuum chamber 202, and a door 230b may be positioned between the sub-chamber 236b and the vacuum chamber 202.

The transport tool 212a may be configured to retrieve semiconductor substrates 110 from the sub-chamber 236a and provide the semiconductor substrates 110 to the transport carrier 208. The transport tool 220a may be configured to retrieve semiconductor substrates 110 from the bottom module 138 and provide the semiconductor substrates 110 to the sub-chamber 236a. The transport tool 212b may be configured to retrieve semiconductor substrates 110 from the transport carrier 208 and provide the semiconductor substrates 110 to the sub-chamber 236b. The transport tool 220b may be configured to retrieve semiconductor substrates 110 from the sub-chamber 236b and provide the semiconductor substrates 110 to the bottom module 138.

The wafer stages 136a and 136b may each be configured to perform a plurality of functions, including receiving semiconductor substrates 110 from the transport tool 220a and/or the transport tool 220b, scanning and/or stepping a semiconductor substrate 110 in a plurality of die exposure fields along a scanner route, and/or scanning and/or stepping a semiconductor substrate 110 in a plurality of measurement operations, among other examples. As further shown in FIG. 2B, each wafer stage 136 includes one or more lift pins 238. A wafer stage 136 may use the one or more lift pins 238 to lower a semiconductor substrate 110 onto the wafer stage 136 and/or to raise a semiconductor substrate 110 off of the wafer stage 136 to permit the semiconductor substrate 110 to be retrieved.

In some implementations, the wafer stages 136a and 136b are configured to operate in a synchronized manner in which the wafer stage 136a steps a first semiconductor substrate 110 in a plurality of die exposure fields along a scanner route while the wafer stage 136b steps a second semiconductor substrate 110 in a plurality of measurement operations (e.g., alignment measurements, overlay measurements) in preparation for exposure to the radiation 106. After exposure of the first semiconductor substrate 110 is complete, the roles of the wafer stages 136a and 136b are reversed such that the wafer stage 136b steps the second semiconductor substrate 110 in a plurality of die exposure fields along a scanner route while the wafer stage 136a steps a third semiconductor substrate 110 in a plurality of measurement operations in preparation for exposure to the radiation 106. In this way, semiconductor substrates 110 are processed concurrently or simultaneously, which reduces queue times in the lithography system 100 and increases throughput of the lithography system 100.

As indicated above, FIGS. 2A and 2B are provided as an example. Other examples may differ from what is described with regard to FIGS. 2A and 2B.

Figure 3A:
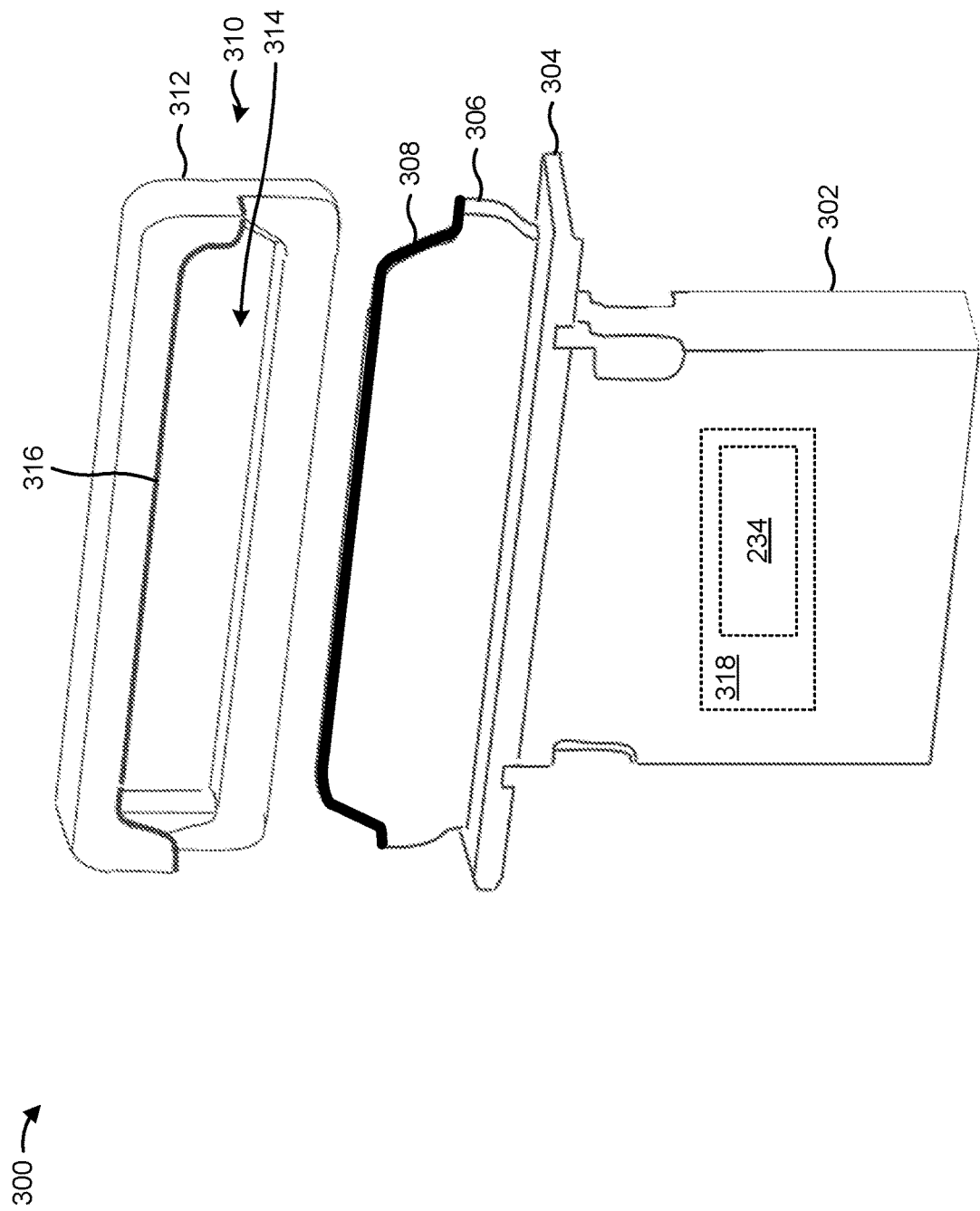

FIGS. 3A-3C are diagrams of an example gate valve system 300 described herein. The gate valve system 300 includes a system that is configured to operate a door included in the lithography system 100. In particular, the gate valve system 300 includes a system that is configured to operate a door in one or more paths of transfer of semiconductor substrates 110 in the lithography system 100, such as a door 228 (e.g., the door 228a, the door 228b), a door 230 (e.g., the door 230a, the door 230b), or a door 232, among other examples.

As shown in FIG. 3A, the gate valve system 300 includes a body 302, a separation plate (or threshold plate) 304, a door 306, a door seal 308, and a door frame 310. The body 302 is located below the separation plate 304. The separation plate 304 physically separates the body 302 from the vacuum chamber 202, from the atmospheric chamber 204, and/or from the load lock chamber 210. The door 306 is configured to move through an opening in the separation plate 304 to selectively open and close. The door 306 includes a door 228 (e.g., the door 228a, the door 228b), a door 230 (e.g., the door 230a, the door 230b), or a door 232, among other examples. The door 306 may be retracted through the opening in the separation plate 304 toward the body 302 to open the door 306. As another example, the door 306 may be extended through the opening in the separation plate 304 away from the body 302 to close the door 306 against the door frame 310. The door seal 308 includes a rubber component, a plastic component, and/or another type of deformable component that provides a seal between the door 306 and the door frame 310 when the door 306 is closed. The seal provides environmental isolation on opposing sides of the door 306.

The door frame 310 includes a body 312, an opening 314 through the body 312, and a valve seat 316. The opening 314 may be positioned between the vacuum chamber 202 and the load lock chamber 210, between the atmospheric chamber 204 and the load lock chamber 210, between the vacuum chamber 202 and the bottom module 138, or in another location in a path of travel of semiconductor substrates 110 in the lithography system 100. The door 306 may be positioned over the opening 314 when the door 306 is closed to provide isolation between environments on opposing sides of the door 306. The door seal 308 may be pressed against the valve seat 316 when the door 306 is closed against the door frame 310. The valve seat 316 includes a rubber component, a plastic component, and/or another type of deformable component that provides a seal between the door 306 and the door frame 310 when the door 306 is closed. The seal provides additional environmental isolation on opposing sides of the door 306.

As further shown in FIG. 3A, the gate valve system 300 includes a gate valve control system 318, which is configured to control operation of the gate valve system 300. The gate valve control system 318 includes a controller 234. The gate valve control system 318 may be included in the body 302 of the gate valve system 300, may be included in another location in the gate valve system 300, may be located remote from the gate valve system 300, and/or may be distributed across a plurality of locations in the lithography system 100. In some implementations, the gate valve control system 318 includes one or more other components that are configured to move the door 306 to selectively open and close the door 306. In some implementations, the controller 234 is configured to communicate with one or more other controllers 234 included in the lithography system 100 to receive indications and/or instructions to open and/or close the door 306.

As described herein, the gate valve control system 318 (including the controller 234) is configured to operate the door 306 at variable movement speeds to reduce, minimize, and/or prevent particle generation due to rubbing of or collision between contact parts of the gate valve system 300. The contact parts may include, for example, the separation plate 304, the door seal 308, and/or the valve seat 316, among other examples. The gate valve control system 318 may operate the door 306 at a relatively high movement speed through a first portion of an actuation operation, such as a first portion or distance of a door closing operation or a door opening operation. The gate valve control system 318 may operate the door 306 at a reduced movement speed (e.g., a movement speed that is less than the high movement speed) through a second portion or distance of the actuation operation in which contact parts of the component are to interact.

In some implementations, the first portion or distance occurs prior to the second portion or distance in an actuation operation such as an actuation operation to close the door 306. In these implementations, the gate valve control system 318 operates the door 306 at the relatively high movement speed, and then slows down the movement speed of the door 306 to the reduced movement speed when the door seal 308 and the valve seat 316 interact as the door 306 is closed against the door frame 310. In some implementations, the first portion or distance occurs prior to the second portion or distance in an actuation operation such as an actuation operation to open the door 306. In these implementations, the gate valve control system 318 operates the door 306 at the relatively high movement speed as the door is initially moved away from the door frame 310, and then slows down the movement speed of the door 306 to the reduced movement speed when the door seal 308 interacts with the separation plate 304 as the door 306 is retracted through the separation plate 304.

The reduced movement speed may reduce friction and/or rubbing between the separation plate 304, the door seal 308, and/or the valve seat 316, which reduces the likelihood of particle generation and/or release of rubber or plastic particles from the door seal 308 and the valve seat 316. The high movement speed provides a high throughput of semiconductor substrates 110 in the lithography system 100. Moreover, the variable operation of the door 306 provided by the gate valve control system 318 reduces wearing of the door seal 308 and the valve seat 316, which increases the operational lifetime of the door seal 308 and the valve seat 316, reduces downtime of the lithography system 100 that would otherwise occur to replace the door seal 308 and/or the valve seat 316, and/or increases productivity and throughput of the lithography system 100, among other examples.

FIGS. 3B and 3C illustrate additional components of the gate valve system 300, including valve pistons 320 and alignment components 322. FIG. 3B illustrates a front elevation view of the gate valve system 300 and FIG. 3C illustrates a side elevation view of the gate valve system 300. As shown in FIGS. 3B and 3C, the valve pistons 320 are coupled to the door 306. The valve pistons 320 are configured to facilitate opening and closing of the door 306 by selectively raising or lowering the door 306. The valve pistons 320 extend through the separation plate 304 to selectively move the door 306 between opened and closed positions. The gate valve control system 318 (including the controller 234) is configured to operate the valve pistons 320 by providing one or more signals to cause the valve pistons 320 to selectively extend and retract.

The alignment blocks 322 are positioned on the body 312 of the door frame 310. The alignment blocks 322 are positioned to guide the door 306 as the door 306 is closed against the door frame 310. The alignment blocks 322 may further assist with maintaining the seal between the door 306 and the door frame 310 by providing a force against the door 306 (which forces the door 306 against the door frame 310) to minimize movement of the door 306 when the door is closed.

As described herein, the gate valve control system 318 (including the controller 234) is configured to operate the door 306 at variable movement speeds to reduce, minimize, and/or prevent particle generation due to rubbing of or collision between contact parts of the gate valve system 300. The reduced movement speed may reduce friction and/or rubbing between the door seal 308 and the alignment blocks 322, which reduces the likelihood of particle generation and/or release of rubber or plastic particles from the door seal 308.

As indicated above, FIGS. 3A-3C are provided as an example. Other examples may differ from what is described with regard to FIGS. 3A-3C.

FIGS. 4A-4C are diagrams of an example implementation 400 described herein. The example implementation 400 includes an example actuation operation of the door 306 in which the door 306 is closed against the door frame 310.

As shown in FIG. 4A, the door 306 is in an opened position in which the opening 314 in the door frame 310 is unobstructed by the door 306. As shown in FIG. 4B, the gate valve control system 318 (and/or the controller 234) initiates movement of the door 306 to transition the door 306 from the opened position to a closed position in which the door 306 is positioned against the door frame 310 over the opening 314. The gate valve control system 318 may initiate movement of the door 306 by causing the valve pistons 320 to extend upward toward the opening 314 in the door frame 310. As described herein, the gate valve control system 318 (including the controller 234) is configured to operate the door 306 at variable movement speeds to reduce, minimize, and/or prevent particle generation due to rubbing of or collision between contact parts of the gate valve system 300. Accordingly, the gate valve control system 318 operates the door 306 at a high initial movement speed in the example actuation operation, and then operates the door 306 at a reduced movement speed as the door 306 comes into contact with the door frame 310.

FIG. 4C shows the door 306 in the closed position against the door frame 310. In some implementations, the door 306 is raised upward toward the opening 314 in the door frame 310 by the valve pistons 320, and then the door 306 is moved forward toward the door frame 310 to form a seal between the door 306 and the door frame 310, as shown in FIG. 4C.

As indicated above, FIGS. 4A-4C are provided as an example. Other examples may differ from what is described with regard to FIGS. 4A-4C.

Figure 5A:
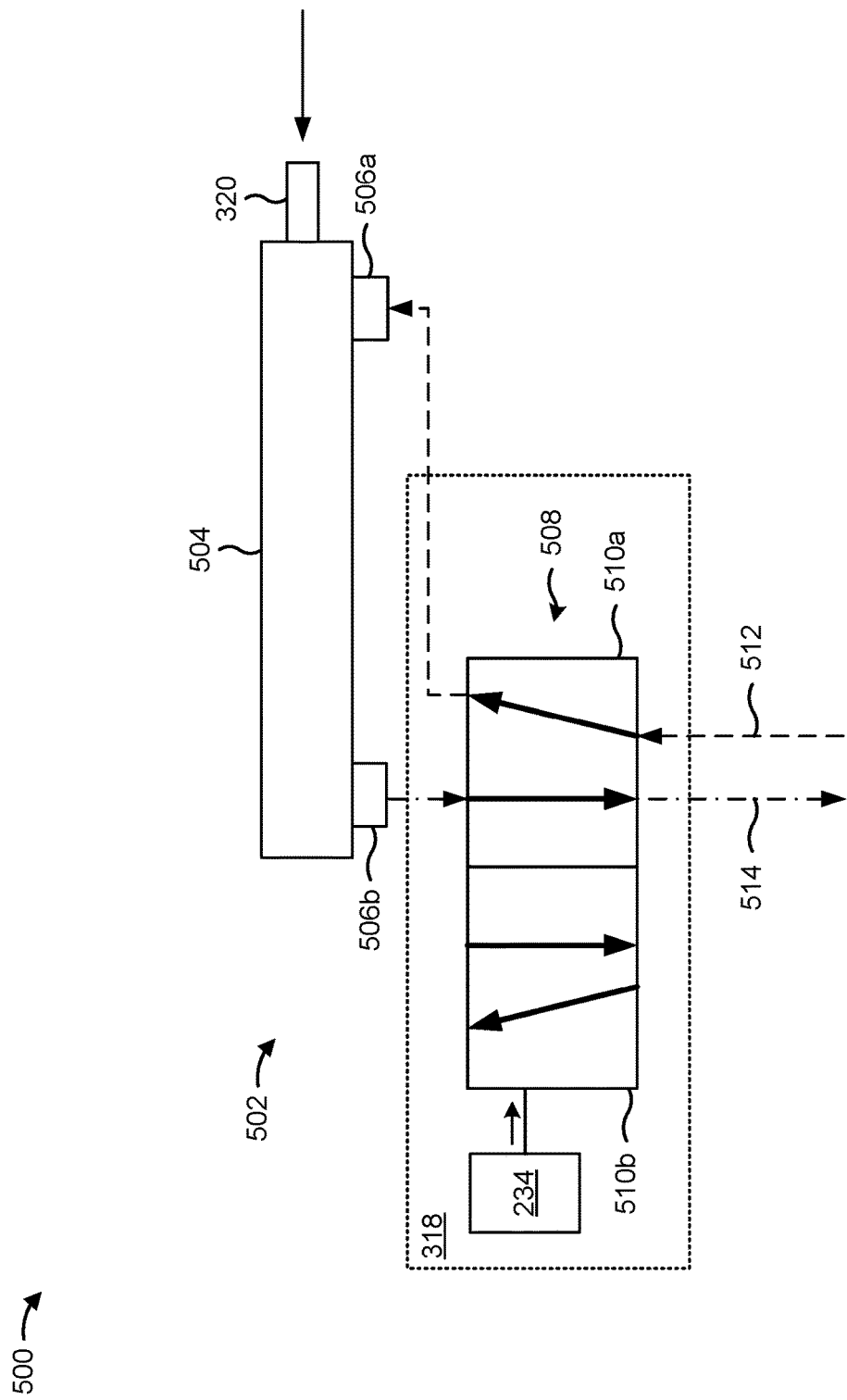
Figure 5B:
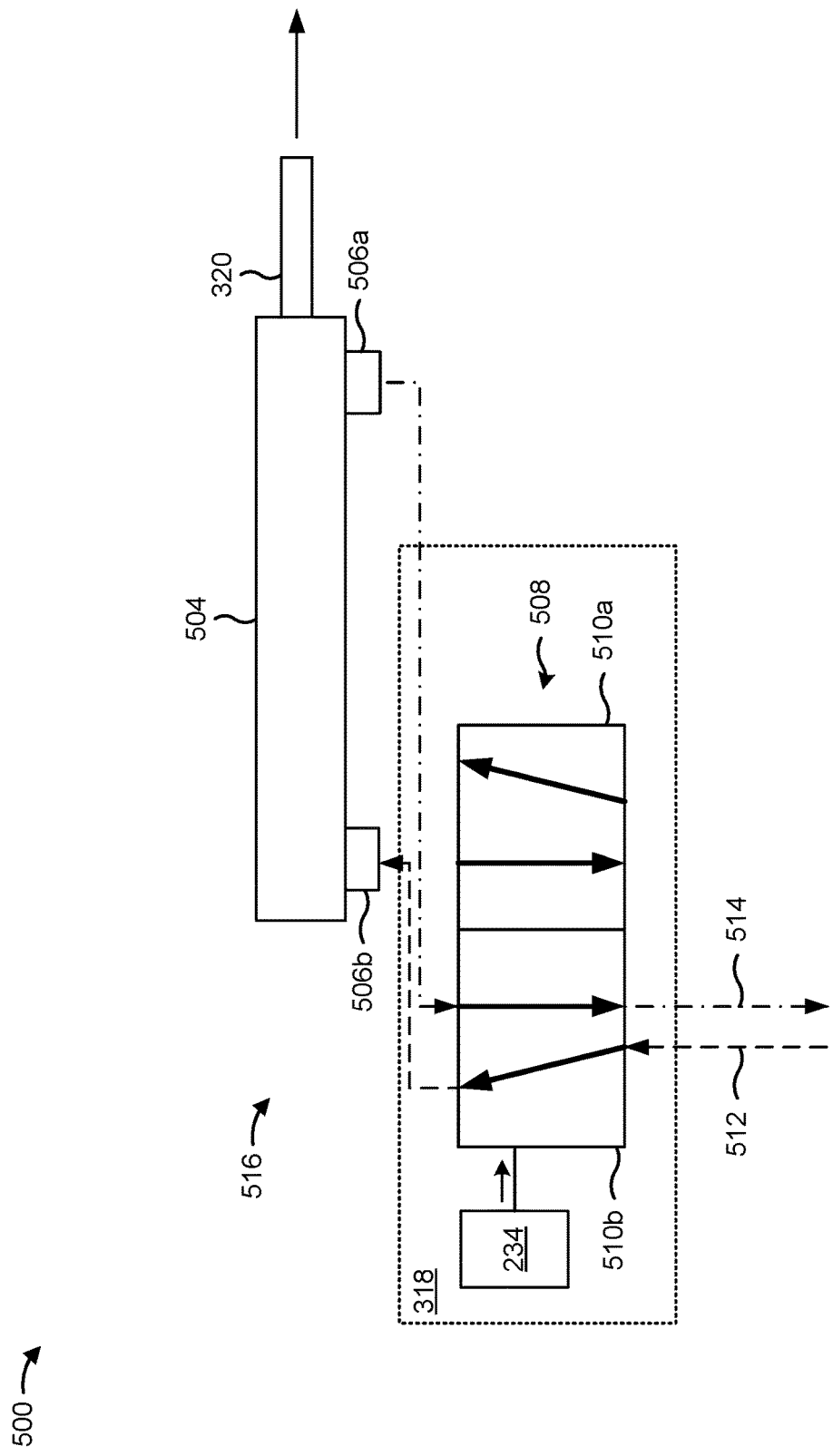

FIGS. 5A and 5B are diagrams of example implementations 500 described herein. In particular, FIGS. 5A and 5B illustrate example implementations 500 of a two-way valve that is configured to operate the valve pistons 320 of the gate valve system 300 to selectively open and close the door 306 of the gate valve system 300.

FIG. 5A illustrates an example implementation 502, which includes an example of retracting the valve pistons 320 into gate valve cylinders 504 of the gate valve system 300. Retracting the valve pistons 320 into the gate valve cylinders 504 may result in the door 306 being opened in some implementations, or may result in the door 306 being closed in other implementations.

The gate valve cylinders 504 may be pneumatically operated. For example, a gas (e.g., air, an inert gas, or another type of gas) may be supplied to a gate valve cylinder 504 to increase a pressure in the gate valve cylinder 504 and to generate a pressure differential in the gate valve cylinder 504. The pressure differential may include a negative pressure from a first end of the gate valve cylinder 504 at which an associated valve piston 320 interfaces with the gate valve cylinder 504, to a second end opposing the first end. In this implementation, the negative pressure differential causes the valve piston 320 to be pulled into the gate valve cylinder 504, which results in retraction of the valve piston 320. Alternatively, the gate valve cylinders 504 may be hydraulically operated, and may operate using hydraulic fluid according to similar principles as described herein.

The negative pressure differential may be generated by the gate valve control system 318. The gate valve control system 318 may supply a gas to a port 506a on the gate valve cylinder 504, and may receive gas from the gate valve cylinder 504 through another port 506b on the gate valve cylinder 504. The supply of the gas to the port 506a (which is located at the first end of the gate valve cylinder 504 at which the valve piston 320 interfaces with the gate valve cylinder 504) results in formation of a positive pressure at the first end of the gate valve cylinder 504. The removal of gas from the gate valve cylinder 504 through the port 506b (which is located at the second end opposing the first end) results in formation of a negative pressure at the second end. The positive pressure at the first end and the negative pressure at the second end results in the negative pressure differential from the first end to the second end, which causes the valve piston 320 to be pulled into the gate valve cylinder 504.

The controller 234 may provide one or more signals to a two-way valve 508 included in the gate valve control system 318 to cause the valve piston 320 to be retracted into the gate valve cylinder 504. The two-way valve 508 includes a valve that is configured to selectively operate in a plurality of configurations (e.g., two configurations), including a first configuration 510a and a second configuration 510b. In some implementations, the two-way valve 508 includes a multi-way valve that is configured to selectively operate in greater than two configurations. In the first configuration 510a, the two-way valve 508 provides a supply gas 512 to the gate valve cylinder 504 through the port 506a, and receives an exhaust gas 514 from the gate valve cylinder 504 through the port 506b.

FIG. 5B illustrates an example implementation 516, which includes an example of extending the valve pistons 320 at least partially out of gate valve cylinders 504 of the gate valve system 300. Extending the valve pistons 320 at least partially out of the gate valve cylinders 504 may result in the door 306 being opened in some implementations, or may result in the door 306 being closed in other implementations. In particular, extending the valve pistons 320 at least partially out of gate valve cylinders 504 actuates the door 306 in an opposing manner relative to retracting the valve pistons 320 into the gate valve cylinders 504.

As shown in FIG. 5B, the controller 234 may provide or transmit one or more signals to the two-way valve 508 to cause the two-way valve 508 to provide the supply gas 512 to a gate valve cylinder 504 to increase a pressure in the gate valve cylinder 504 and to generate a pressure differential in the gate valve cylinder 504. The pressure differential may include a negative pressure from the second end of the gate valve cylinder 504 to the first end of the gate valve cylinder 504. In this implementation, the negative pressure differential causes the valve piston 320 to be at least partially pushed out of the gate valve cylinder 504, which results in extension of the valve piston 320.

The gate valve control system 318 (e.g., through the two-way valve 508 operating in the second configuration 510b) may provide the supply gas 512 to the port 506b on the gate valve cylinder 504, and may receive the exhaust gas 514 from the gate valve cylinder 504 through the port 506a. The supply gas provided to the first end of the gate valve cylinder 504 results in formation of a positive pressure at the second end of the gate valve cylinder 504. The removal of the exhaust gas 514 from the gate valve cylinder 504 through the port 506a results in formation of a negative pressure at the first end. The positive pressure at the second end and the negative pressure at the first end results in the negative pressure differential from the second end to the first end, which causes the valve piston 320 to be pushed at least partially out of the gate valve cylinder 504.

As indicated above, FIGS. 5A and 5B are provided as examples. Other examples may differ from what is described with regard to FIGS. 5A and 5B.

Figure 6:
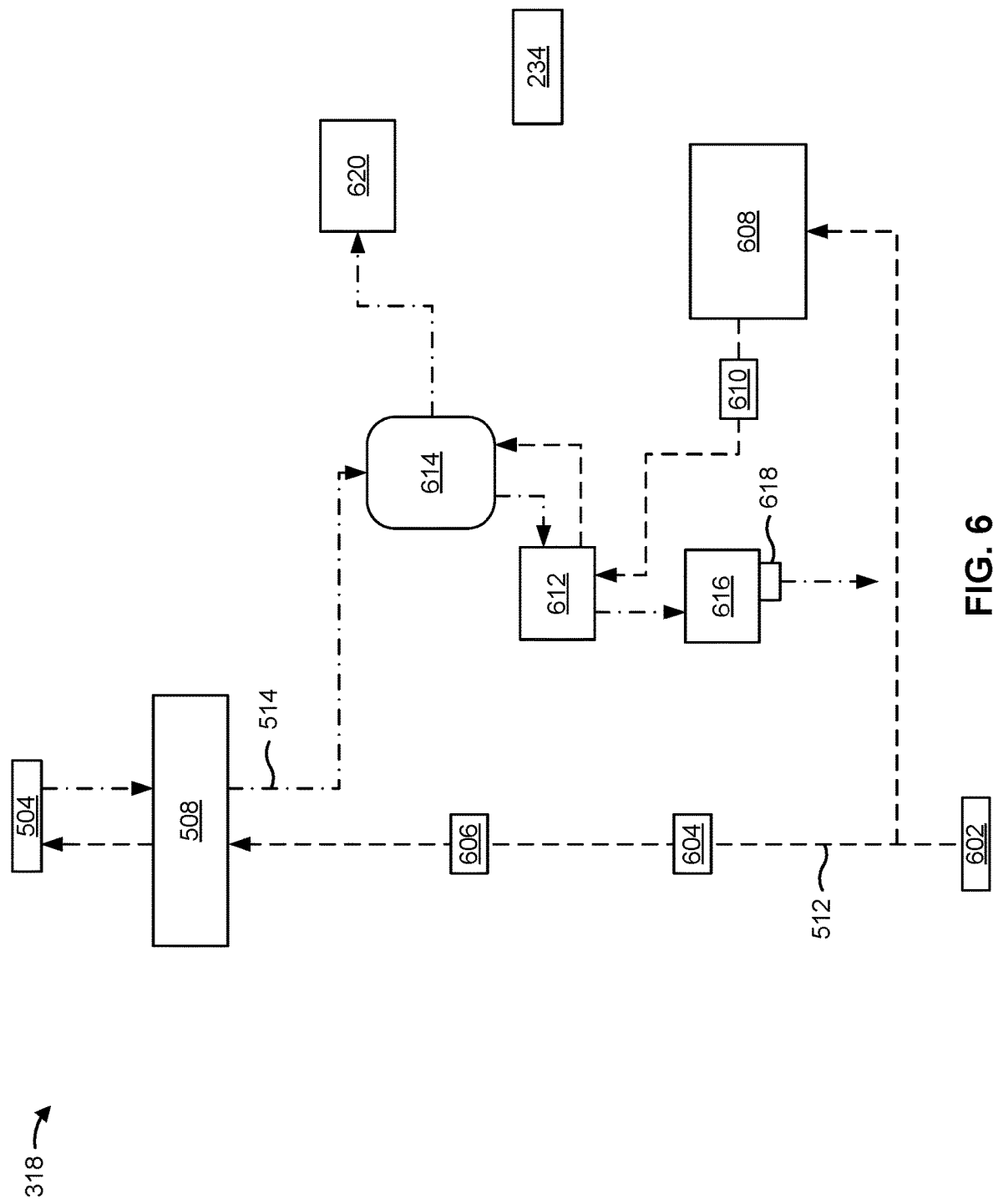
FIG. 6 is a diagram of an example gate valve control system described herein.

FIG. 6 is a diagram of an example gate valve control system 318 described herein. The gate valve control system 318 may be included in a gate valve system 300 included in the lithography system 100 described herein. The gate valve control system 318 is configured to operate the door 306 of the gate valve system 300 at variable movement speeds to reduce, minimize, and/or prevent particle generation due to rubbing of or collision between contact parts of the gate valve system 300.

As shown in FIG. 6, the gate valve control system 318 includes a facility gas supply inlet 602 through which the supply gas 512 is received by the gate valve control system 318. The facility gas supply inlet 602 may receive the supply gas 512 from facility gas source or from another type of gas source. The supply gas 512 may include a clean dry air (CDA), an extra clean dry air (XCDA), an inert gas (e.g., a nitrogen (N2) gas), and/or another type of gas.

The supply gas 512 is provided to the two-way valve 508 of the gate valve control system 318. In some implementations, supply gas 512 is provided to the two-way valve 508 through one or more components of the gate valve control system 318, such as a one-way valve 604 and/or a flowmeter 606. The one-way valve 604 includes a check valve, a reflux valve, or another type of valve that permits one-way flow (and prevents backflow) of the supply gas 512 from the facility gas supply inlet 602 to the two-way valve 508. The flowmeter 606 is configured to measure (or generate sensor data based on) one or more properties of a flow of the supply gas 512 between the facility gas supply inlet 602 and the two-way valve 508. The one or more properties may include, for example, a flow speed, a flow rate, a flow volume, and/or an energy flow, among other examples. The flowmeter 606 may transmit or provide the sensor data to the controller 234.

The supply gas 512 may also be provided from the facility gas supply inlet 602 to a proportional valve 608. The proportional valve 608 includes a valve that regulates an output of the supply gas 512 based on an input of the supply gas 512. In particular, the proportional valve 608 adjusts the output of the supply gas 512 from the proportional valve 608 such that the output is proportional to the input of the supply gas 512 to the proportional valve 608. This enables the output of the supply gas 512 to be variable in a highly-controlled manner.

The output of the supply gas 512 from the proportional valve 608 is provided through a one-way valve 610 to a solenoid valve 612 and to a gas tank 614 in which the supply gas 512 is stored. The gas tank 614 is used to provide a back pressure to the gate valve cylinder 504, which is a pressure that at least partially opposes the flow of the exhaust gas 514 from the two-way valve 508 to the gas tank 614. The back pressure is used to control the negative pressure differential in a gate valve cylinder 504, which enables the gate valve control system 318 to control the speed at which an associated valve piston 320 is extended or retracted. Thus, the back pressure provided to the gate valve cylinder 504 (e.g., through the two-way valve 508) enables the gate valve control system 318 to provide variable speed control of the door 306 (e.g., the door 228, the door 228a, the door 228b, the door 230, the door 230a, the door 230b, the door 232, and/or another door in the lithography system 100) of the gate valve system 300.

The solenoid valve 612, along with another solenoid valve 616 that is downstream from the solenoid valve 612, are configured to control the magnitude of the back pressure to the gate valve cylinder 504. The controller 234 is configured to communicate with the solenoid valve 612 and the solenoid valve 616 to achieve variable control of the door 306. As an example, the controller 234 is configured to provide or transmit one or more signals to the solenoid valve 612 to cause the solenoid valve 612 to remove or exhaust at least a partial amount of gas stored in the gas tank 614 (which may include a mixture of the supply gas 512 and the exhaust gas 514) to adjust the back pressure. As another example, the controller 234 is configured to provide or transmit one or more signals to the solenoid valve 616 to cause the solenoid valve 616 to remove or exhaust at least a partial amount of the gas, removed the gas tank 614 by the solenoid valve 612, from the gate valve control system 318 to adjust the back pressure. The solenoid valve 616 may remove the gas from the gate valve control system 318 through an exhaust port 618 of the gate valve control system 318. In some implementations, the controller 234 is configured to provide or transmit signals to the solenoid valve 612 and the solenoid valve 616 to cause the solenoid valve 612 and the solenoid valve 616 to adjust the back pressure.

The gate valve control system 318 includes a pressure sensor 620 (or a plurality of pressure sensors 620) that is configured to generate sensor data based on the back pressure from the gate valve cylinder 504. The sensor data may indicate, for example, a magnitude of the back pressure. Moreover, the pressure sensor 620 may be configured to generate sensor data based on a pressure of the gas in the gas tank 614. The pressure sensor 620 may provide or transmit sensor data to the controller 234. The controller 234 may perform one or more actions based on the sensor data. For example, the controller 234 may provide or transmit one or more signals to cause the supply gas 512 to be provided to the two-way valve 508. As another example, the controller 234 may provide or transmit one or more signals to cause the supply gas 512 to be provided to the gas tank 614. As another example, the controller 234 may provide or transmit one or more signals to cause the solenoid valve 612 and/or the solenoid valve 616 to selectively open or close to adjust the back pressure.

As indicated above, FIG. 6 is provided as an example. Other examples may differ from what is described with regard to FIG. 6.

FIGS. 7A-7D are diagrams of an example implementation 700 described herein. The example implementation 700 includes an example of variable speed control of the door 306 of the gate valve system 300. The example implementation 700 includes an actuation operation of the door 306, such as an actuation operation to open the door 306 or an actuation operation to close the door 306.

Figure 7A:
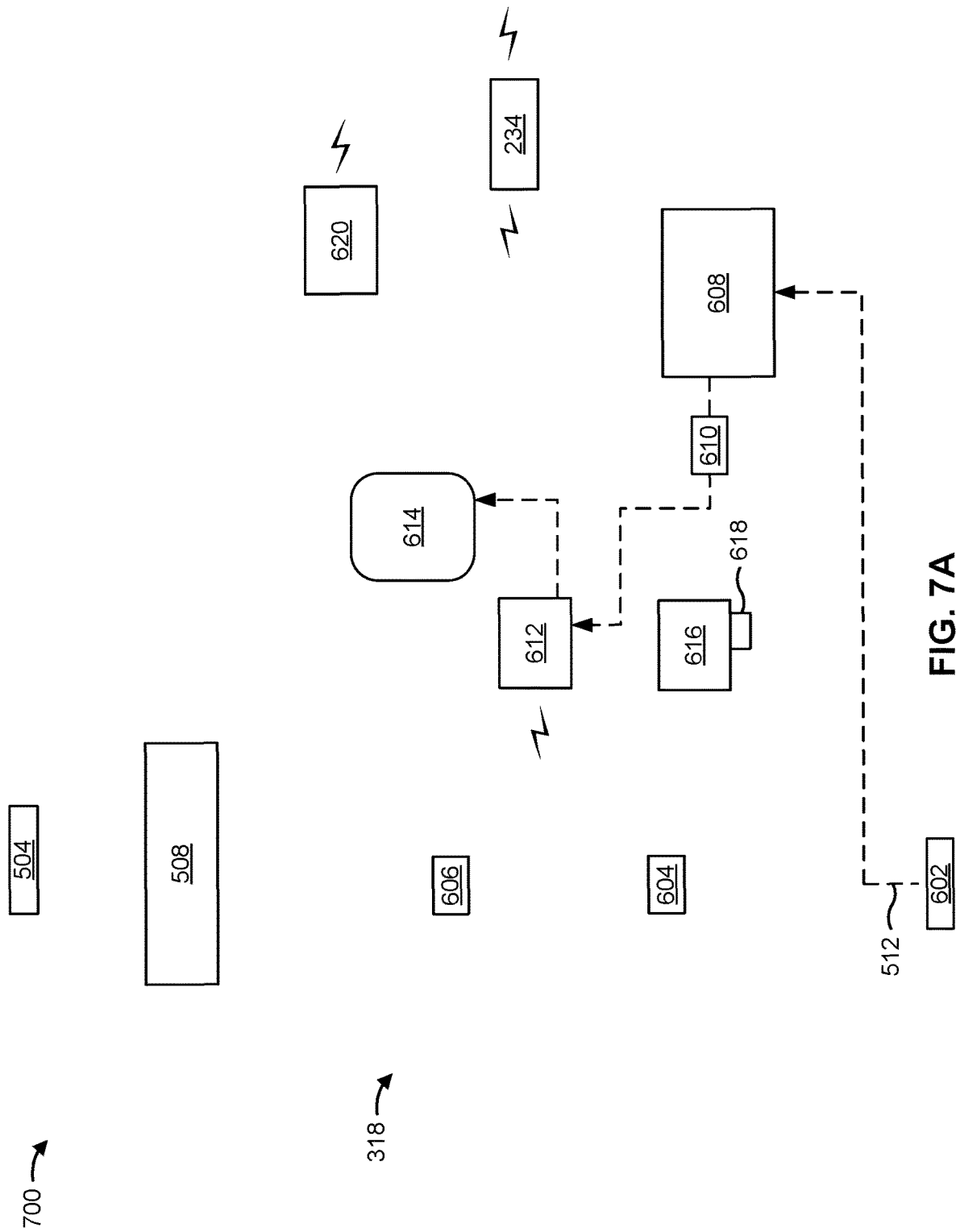
FIGS. 7A-7D, 8A, and 8B are diagrams of an example implementation described herein.

As shown in FIG. 7A, the controller 234 may provide or transmit one or more signals to cause a portion of the supply gas 512 to be provided into the gate valve control system 318 and to the gas tank 614 to fill the gas tank 614. The supply gas 512 may be provided from the facility gas supply inlet 602 to the gas tank 614 through the proportional valve 608, through the one-way valve 610, and through the solenoid valve 612. The controller 234 may provide one or more signals to the solenoid valve 612 to permit the flow of the supply gas 512 through the solenoid valve 612 and to the gas tank 614.

Moreover, the controller 234 may receive sensor data from the pressure sensor 620. The controller 234 may determine a pressure of the gas in the gas tank 614 based on the sensor data received from the pressure sensor 620. The controller 234 may determine that the gas tank 614 has been pressurized to a particular pressure based on the sensor data. Moreover, the controller 234 may determine, based on the sensor data, that the pressure in the gas tank 614 satisfies a pressure threshold. Accordingly, the controller 234 may provide or transmit one or more signals to the solenoid valve 612 and/or to another component included in the gate valve control system 318 to stop the flow of the supply gas 512 to the gas tank 614 based on determining that the pressure in the gas tank 614 satisfies the pressure threshold.

Figure 7B:
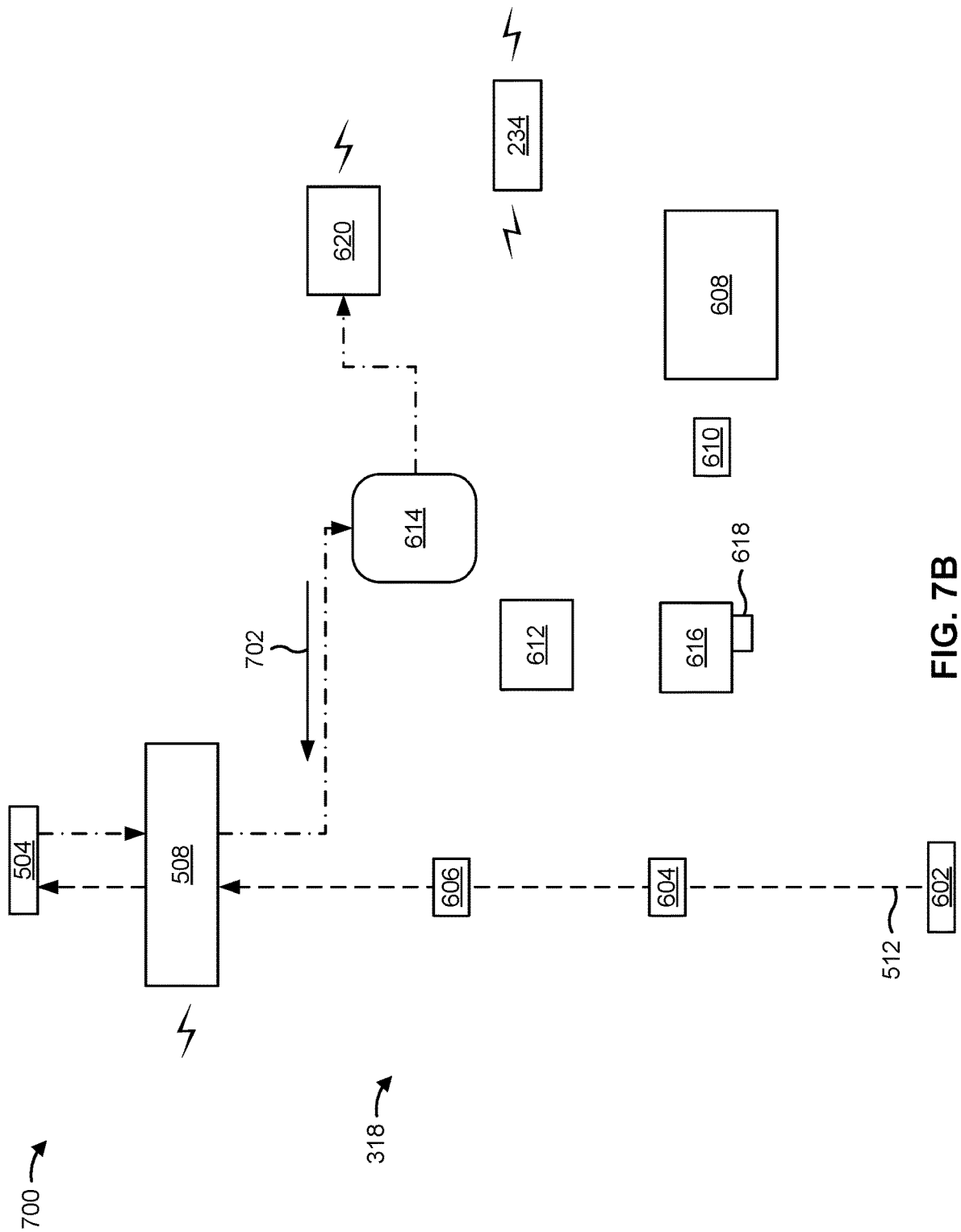

As shown in FIG. 7B, the controller 234 may provide or transmit one or more signals to cause another portion of the supply gas 512 to be provided to the two-way valve 508. The supply gas 512 may be provided from the facility gas supply inlet 602, through the one-way valve 604, and through the flowmeter 606 to the two-way valve 508. Moreover, the controller 234 may provide or transmit one or more signals to the two-way valve 508 to cause the two-way valve 508 to operate in a particular configuration, such as the first configuration 510a, the second configuration 510b, or another configuration. In this way, the supply gas 512 is provided through the two-way valve 508 to the gate valve cylinder 504, and the exhaust gas 514 is received by the gate valve control system 318 from the gate valve cylinder 504 at the two-way valve 508. The exhaust gas 514 flows from the two-way valve 508 to the gas tank 614.

In some implementations, the controller 234 provides or transmits the one or more signals to the two-way valve 508 based on receiving one or more signals from another controller (e.g., another controller 234) of the lithography system 100. The one or more signals may be provided to the controller 234 of the gate valve control system 318 based on a semiconductor substrate 110 being transferred along a path of travel through the lithography system 100. As an example, the one or more signals may be provided to the controller 234 based on a semiconductor substrate 110 being transferred between the vacuum chamber 202 and the load lock chamber 210. As another example, the one or more signals may be provided to the controller 234 based on a semiconductor substrate 110 being transferred between the atmospheric chamber 204 and the load lock chamber 210. As another example, the one or more signals may be provided to the controller 234 based on a semiconductor substrate 110 being transferred between the vacuum chamber 202 and the bottom module 138.

As further shown in FIG. 7B, the pressurization of the gas tank 614 results in the gate valve control system 318 providing a back pressure 702 to the gate valve cylinder 504 through the two-way valve 508. The pressure sensor 620 generates sensor data based on the back pressure 702 and provides or transmits the sensor data to the controller 234. The controller 234 receive the sensor data and monitors, based on the sensor data, a magnitude of the back pressure 702, a rate of change of the back pressure 702, and/or another parameter of the back pressure 702.

The controller 234 determines that the door 306 is moving (e.g., determines that the associated valve piston 320 is being retracted or extended) based on the back pressure 702. In some implementations, the controller 234 determines that the door 306 is in motion based on a rate of change of the back pressure 702. As an example, the controller 234 may determine that the rate of change of the back pressure 702 satisfies a rate threshold, and may determine that movement of the door has started based on determining that the rate of change of the back pressure 702 satisfies the rate threshold. In some implementations, the controller 234 determines that the door 306 is in motion based on the magnitude of the back pressure 702. As an example, the controller 234 may determine that the magnitude of the back pressure 702 satisfies a magnitude threshold, and may determine that movement of the door has started based on determining that the magnitude of the back pressure 702 satisfies the magnitude threshold.

The controller 234 may monitor the back pressure 702 relative to one or more back pressure thresholds based on determining that movement of the door 306 has started. In these implementations, the controller 234 receives sensor data associated with the back pressure 702 from the pressure sensor 620 and compares the magnitude of the back pressure 702 with the one or more back pressure thresholds. The controller 234 monitors the back pressure 702 relative to the one or more back pressure thresholds to provide variable speed control of movement of the door 306 across one or more movement distances of the door 306 in the actuation operation.

The back pressure 702 continues to increase as more supply gas 512 is provided to the gate valve cylinder 504. The volume of the supply gas 512 in the gate valve cylinder 504 increases as more supply gas 512 is provided to the gate valve cylinder 504, which increases the pressure in the gate valve cylinder 504. The increased pressure causes the speed of movement of the door 306 to increase to a first speed across a first movement distance of the door 306 in the actuation operation. The controller 234 may determine that the door 306 is moving at the first movement speed based on monitoring the back pressure 702 relative to a first back pressure threshold. In particular, the controller 234 may determine that the door 306 is moving at the first movement speed based determining that the back pressure 702 satisfies a first back pressure threshold.

Figure 7C:
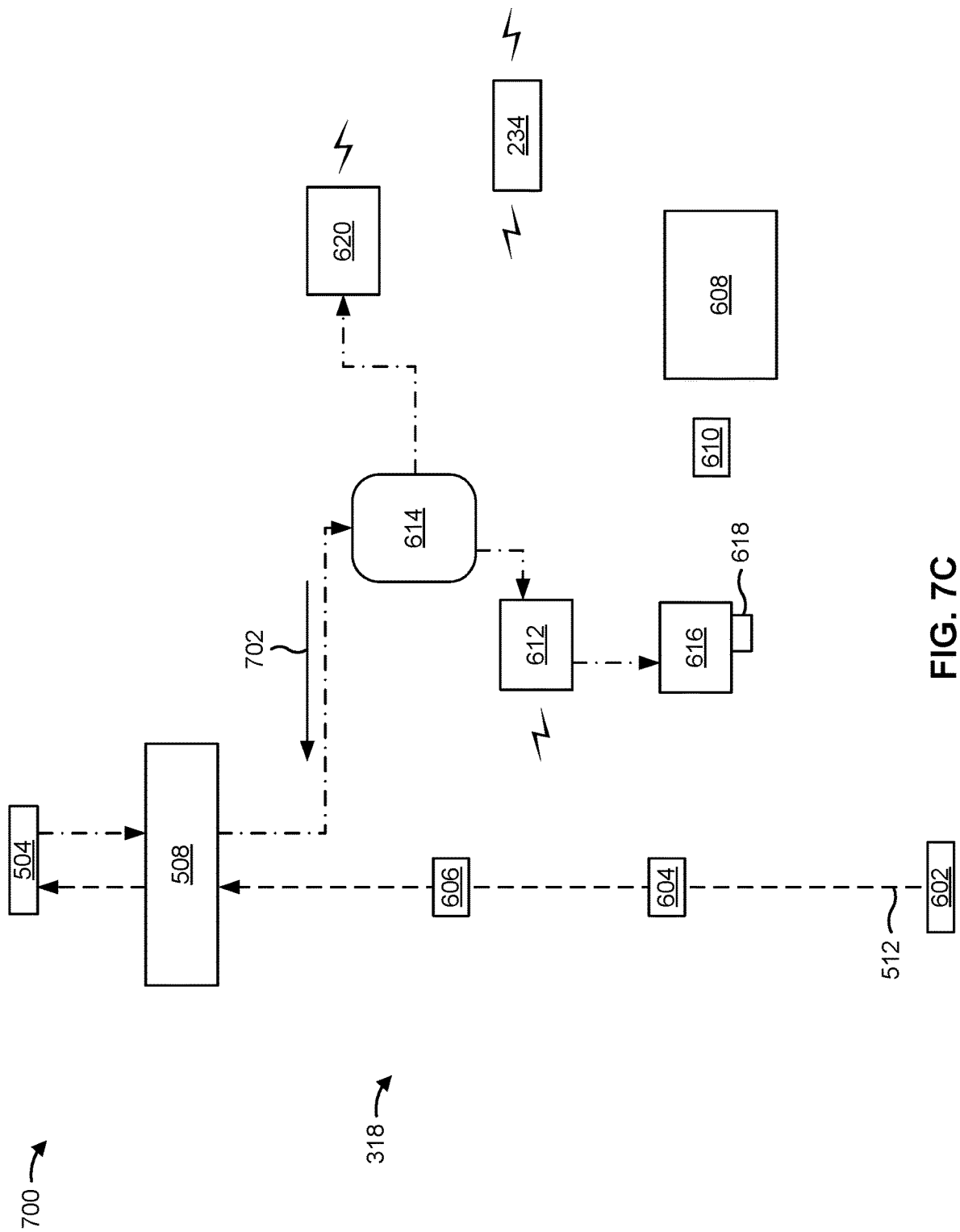

As shown in FIG. 7C, to provide the variable speed control of the door 306, the controller 234 provides or transmits one or more signals to the solenoid valve 612 to cause the solenoid valve 612 to open such that the solenoid valve 612 removes or exhausts some of the gas from the gas tank 614. The gate valve control system 318 removes of a portion of the gas in the gas tank 614 through the solenoid valve 612 to cause the back pressure 702 to be reduced, which decreases the pressure in the gate valve cylinder 504. The decreased pressure in the gate valve cylinder 504 results in the speed of movement of the door 306 to be reduced from the first movement speed to a second movement speed. In this way, the door 306 moves at the first movement speed along the first movement distance of the actuation operation based on a first pressure of the back pressure 702, and moves at the second (lesser) movement speed along a second movement distance of the actuation operation (e.g., after the first movement distance) based on a second (reduced) pressure of the back pressure 702. Additionally and/or alternatively, the controller 234 may cause the door 306 to move at the second movement speed by causing a rate of increase of the back pressure 702 to be reduced.

The controller 234 may cause the speed of movement of the door 306 to be reduced from the first movement speed to the second movement speed based on determining that the door 306 is approaching (or coming into contact with) the door frame 310 or the separation plate 304 of the gate valve system 300. In this way, the controller 234 reduces the speed of movement of the door 306 to reduce, minimize, and/or prevent the likelihood of particle generation and/or release of rubber or plastic particles (and/or another type of particles) from the door seal 308 and/or the valve seat 316.

The controller 234 may determine to reduce the speed of movement of the door 306 based on monitoring the back pressure 702 relative to a second back pressure threshold. The second back pressure threshold may be greater relative to the first back pressure threshold. For example, the first back pressure threshold may be included in a range of approximately 4.0 bar to approximately 4.3 bar, whereas the second back pressure threshold may be included in a range of approximately 4.4 bar to approximately 4.6 bar. However, other values for the first back pressure threshold and the second back pressure threshold are within the scope of the present disclosure.

The controller 234 may receive sensor data from the pressure sensor 620, may determine and/or monitor the magnitude of the back pressure 702 based on the sensor data, and may determine that the magnitude of the back pressure 702 satisfies the second back pressure threshold. Accordingly, the controller 234 may provide or transmit the one or more signals to the solenoid valve 612 to cause the solenoid valve 612 to open (e.g., to remove or exhaust a portion of the gas from the gas tank 614) based on determining that the magnitude of the back pressure 702 satisfies the second back pressure threshold.

Figure 7D:
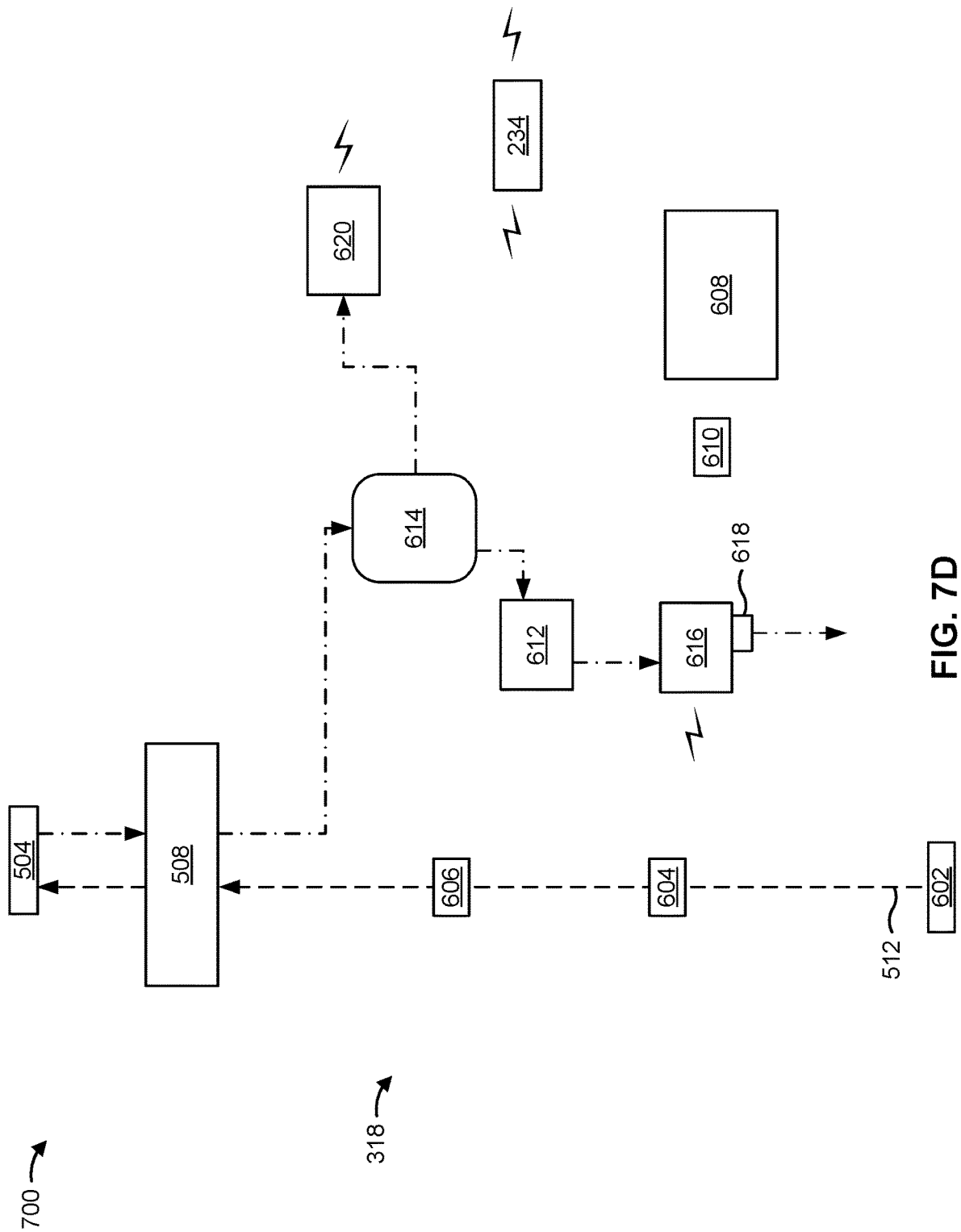

As shown in FIG. 7D, in some implementations, the controller 234 provides additional the variable speed control of the door 306 by releasing the back pressure 702 from the gate valve control system 318. This causes the speed of movement of the door 306 to greatly reduce across a third movement distance (e.g., after the first and second movement distances) associated with the door being closed against the door frame 310 or opened against the separation plate 304. The controller 234 may provide or transmit one or more signals to the solenoid valve 616 to cause the solenoid valve 616 to open such that the solenoid valve 616 removes or exhausts the gas, that was from the gas tank 614 by the solenoid valve 612, from the gate valve control system 318. The decreased pressure in the gate valve cylinder 504 results in the speed of movement of the door 306 to be fully extended or retracted with little resistance force.

The controller 234 may cause the speed of movement of the door 306 to be reduced from the second movement speed to the third movement speed based on determining that the door 306 is in contact with the door frame 310 or the separation plate 304. In this way, the controller 234 reduces the speed of movement of the door 306 to reduce, minimize, and/or prevent the likelihood of particle generation and/or release of rubber or plastic particles (and/or another type of particles) from the door seal 308 and the valve seat 316.

The controller 234 may determine to reduce the speed of movement of the door 306 based on monitoring the back pressure 702 relative to a third back pressure threshold. The third back pressure threshold may be greater relative to the first back pressure threshold and the second back pressure threshold. For example, the third back pressure threshold may be included in a range of approximately 4.7 bar to approximately 5.0 bar, whereas the first back pressure threshold may be included in a range of approximately 4.0 bar to approximately 4.3 bar and the second back pressure threshold may be included in a range of approximately 4.4 bar to approximately 4.6 bar. However, other values for the first back pressure threshold, the second back pressure threshold, and the third back pressure threshold are within the scope of the present disclosure.

The controller 234 may receive sensor data from the pressure sensor 620, may determine and/or monitor the magnitude of the back pressure 702 based on the sensor data, and may determine that the magnitude of the back pressure 702 satisfies the third back pressure threshold. Accordingly, the controller 234 may provide or transmit the one or more signals to the solenoid valve 612 to cause the solenoid valve 616 to open (e.g., to remove or exhaust a portion of the gas from the gate valve control system 318) based on determining that the magnitude of the back pressure 702 satisfies the third back pressure threshold.

In some implementations, the controller 234 controls the solenoid valve 612 and/or the solenoid valve 616 based on a machine learning model. For example, the controller 234 may determine, using the machine learning model, one or more pressure settings for the back pressure 702, and may provide one or more signals to the solenoid valve 612 and/or the solenoid valve 616 to cause the solenoid valve 612 and/or the solenoid valve 616 to adjust the back pressure 702 based on the one or more pressure settings. The one or more pressure settings may include, for example, an amount of that the solenoid valve 612 and/or the solenoid valve 616 are to open (e.g., a position of the solenoid valve 612 and/or the solenoid valve 616), an amount of gas that the solenoid valve 612 and/or the solenoid valve 616 are to remove or exhaust from the gas tank 614 (e.g., based on a flow rate and/or flow volume through the solenoid valve 612 and/or the solenoid valve 616), and/or another parameter.

In some implementations, the controller 234 uses the machine learning model to determine the one or more pressure settings by providing candidate pressure settings as input to the machine learning model, and using the machine learning model to determine a likelihood, probability, or confidence that a particular outcome (e.g., a likelihood of a particular movement speed for the door 306, a likelihood of particle generation) for the actuation operation will be achieved using the candidate pressure settings. The controller 234 (or another system) may train, update, and/or refine the machine learning model to increase the accuracy of the outcomes and/or parameters determined using the machine learning model. The controller 234 may train, update, and/or refine the machine learning model based on feedback and/or results from the actuation operation for the door 306, as well as from historical or related actuation operations (e.g., from hundreds, thousands, or more historical or related actuation operations) performed by the gate valve system 300.

In some implementations, one or more other controllers 234 of the lithography system 100 are configured to provide variable speed control of one or more other components in one or more paths of transfer of semiconductor substrates 110 in the lithography system 100. A controller 234 may control an electromechanical motor of a component in the lithography system 100 by providing signals to cause the electromechanical motor to actuate at different speeds. As an example, a controller 234 may be configured to provide variable speed control of the lift pin 216 of the pre-alignment component 214 by causing the lift pin 216 to move at a first movement speed across a first movement distance and at a second (reduced) movement speed across a second (subsequent) movement distance to reduce particle generation by the lift pin 216. As another example, a controller 234 may be configured to provide variable speed control of the lift pin 224 of the pre-alignment component 222 by causing the lift pin 224 to move at a first movement speed across a first movement distance and at a second (reduced) movement speed across a second (subsequent) movement distance to reduce particle generation by the lift pin 224. As another example, a controller 234 may be configured to provide variable speed control of the lift pin 238 of a wafer stage 136 by causing the lift pin 238 to move at a first movement speed across a first movement distance and at a second (reduced) movement speed across a second (subsequent) movement distance to reduce particle generation by the lift pin 238.

As indicated above, FIGS. 7A-7D are provided as an example. Other examples may differ from what is described with regard to FIGS. 7A-7D.

Figure 8A:
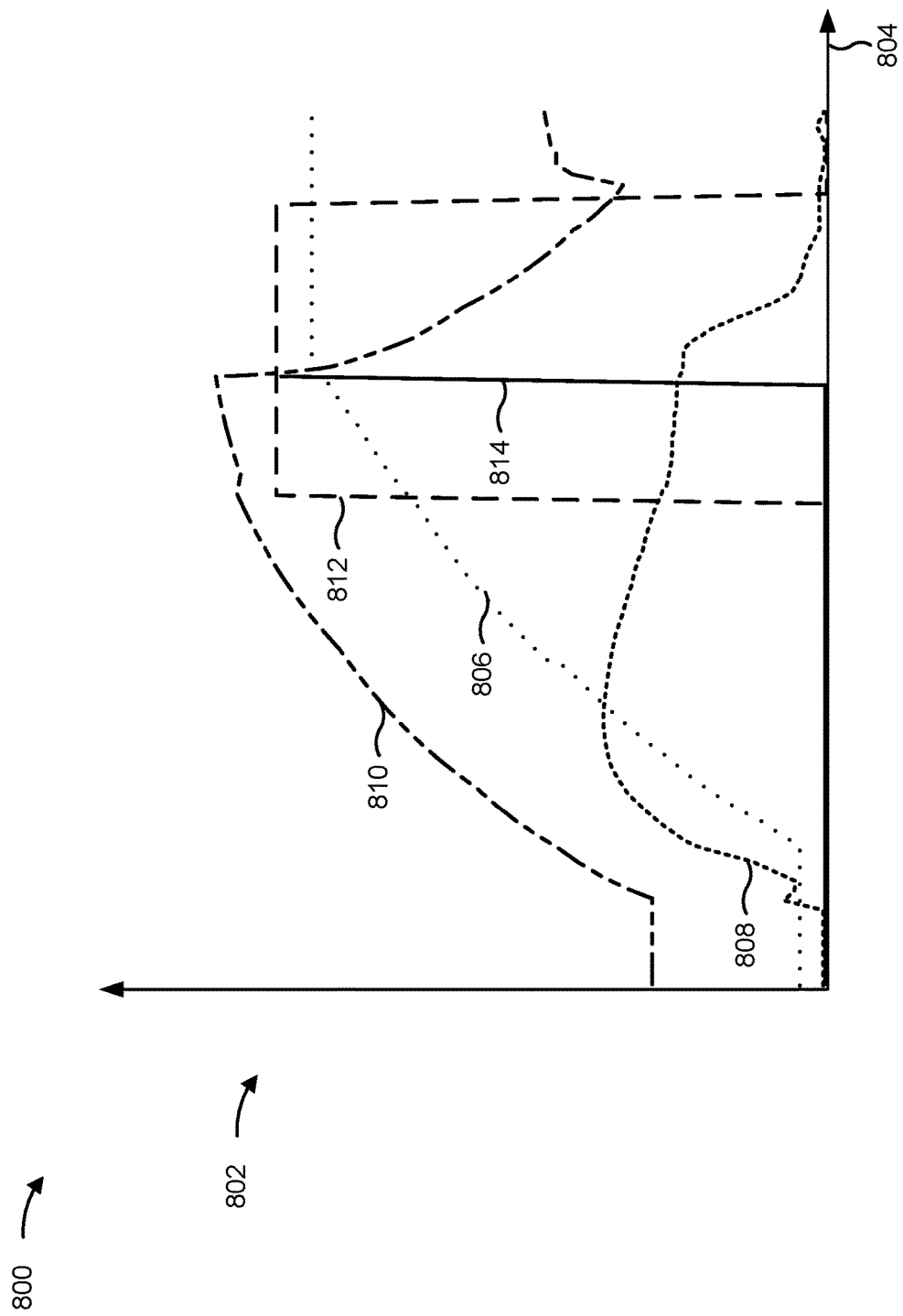
Figure 8B:
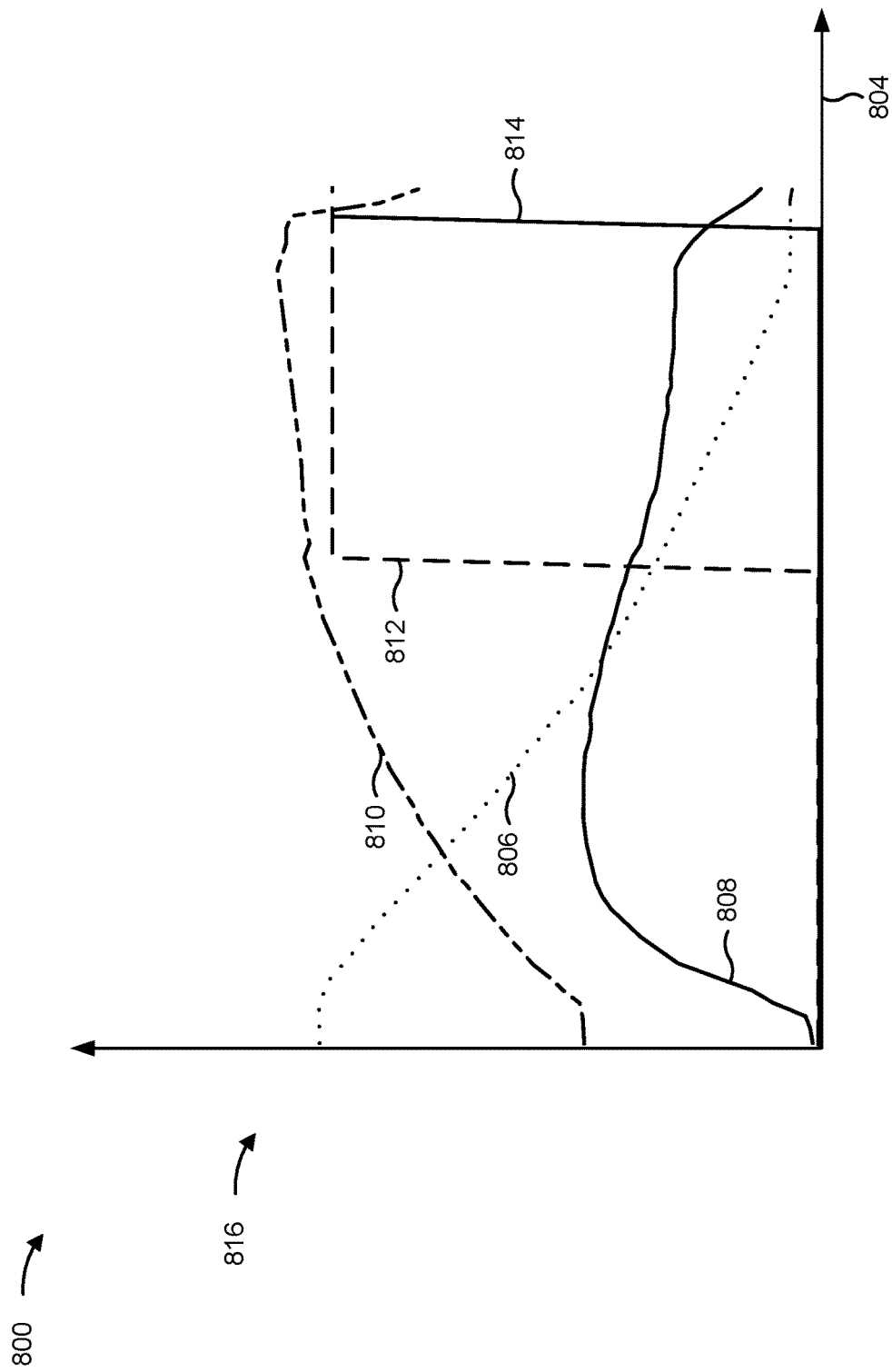

FIGS. 8A and 8B are diagrams of example implementations 800 described herein. In particular, FIGS. 8A and 8B illustrate example implementations 800 of timing relationships between a plurality of parameters in actuation operations of a door 306 of a gate valve system 300 described herein.

FIG. 8A illustrates an example implementation 802, which includes an example of timing relationships between a plurality of parameters in actuation operation to close the door 306 across a time duration 804. As shown in FIG. 8A, the parameters may include a position 806 of the door 306, an airflow 808 of the supply gas 512 to a gate valve cylinder 504, a back pressure 810 (e.g., the back pressure 702) on the gate valve cylinder 504 associated with the door 306, a position 812 of the solenoid valve 612, and a position 814 of the solenoid valve 616.

As shown in FIG. 8A, the position 806 of the door gradually increases from an open position to a closed position in which the door 306 is pressed against the door frame 310. The airflow 808 increases until the gate valve cylinder 504 is filled with the supply gas 512, at which point the airflow 808 decreases as the pressure in the gate valve cylinder 504 increases. The back pressure 810 gradually increases until the variable speed control described herein is implemented (e.g., by a controller 234). To implement the variable speed control of the door 306, the position 812 of the solenoid valve 612 is adjusted to an open position such that the rate of increase of the back pressure 810 is reduced, which causes the position 806 to increase at a decreasing rate of speed. As the door 306 comes in contact with the door frame 310, the position 814 of the solenoid valve 616 is adjusted to an open position such that the back pressure 810 is released, which causes the position 806 to remain constant.

FIG. 8B illustrates an example implementation 816, which includes an example of timing relationships between a plurality of parameters in actuation operation to open the door 306 across a time duration 804. As shown in FIG. 8B, the position 806 of the door gradually decreases from a closed position to an open position in which the door 306 is pressed against the door frame 310. The airflow 808 increases until the gate valve cylinder 504 is filled with the supply gas 512, at which point the airflow 808 decreases as the pressure in the gate valve cylinder 504 increases. The back pressure 810 gradually increases until the variable speed control described herein is implemented (e.g., by a controller 234). To implement the variable speed control of the door 306, the position 812 of the solenoid valve 612 is adjusted to an open position such that the rate of increase of the back pressure 810 is reduced, which causes the position 806 to decrease at a decreasing rate of speed. As the door 306 comes in contact with the door frame 310, the position 814 of the solenoid valve 616 is adjusted to an open position such that the back pressure 810 is released, which causes the position 806 to remain constant.

As indicated above, FIGS. 8A and 8B are provided as examples. Other examples may differ from what is described with regard to FIGS. 8A and 8B.

Figure 9:
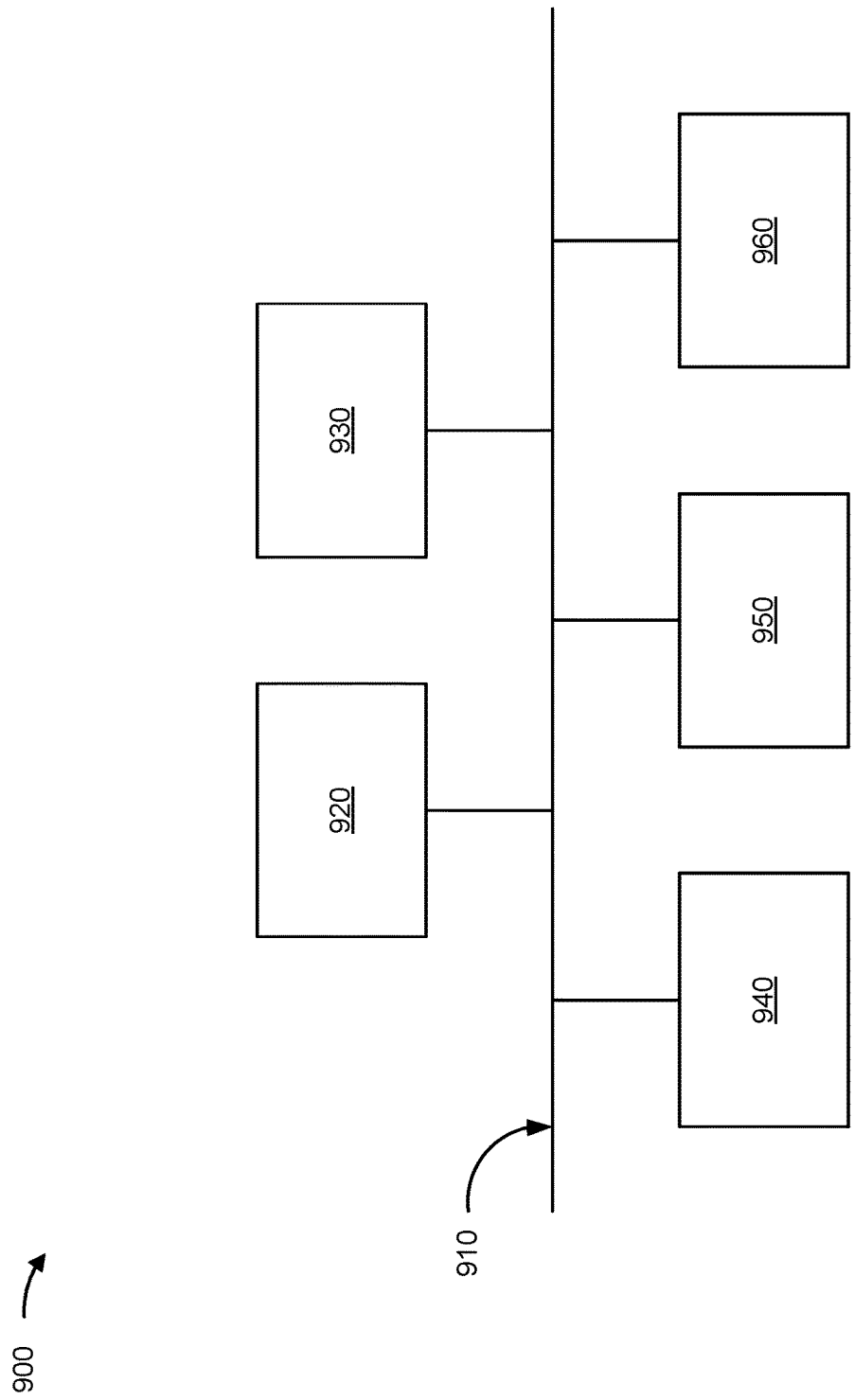
FIG. 9 is a diagram of example components of one or more devices described herein.

FIG. 9 is a diagram of example components of a device 900, which may correspond to the controller 234, the proportional valve 608, the flowmeter 606, the solenoid valve 612, the solenoid valve 616, the pressure sensor 620, another component included in the gate valve control system 318, and/or another component included in the lithography system 100, among other examples. In some implementations, the controller 234, the proportional valve 608, the flowmeter 606, the solenoid valve 612, the solenoid valve 616, the pressure sensor 620, another component included in the gate valve control system 318, and/or another component included in the lithography system 100 may include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
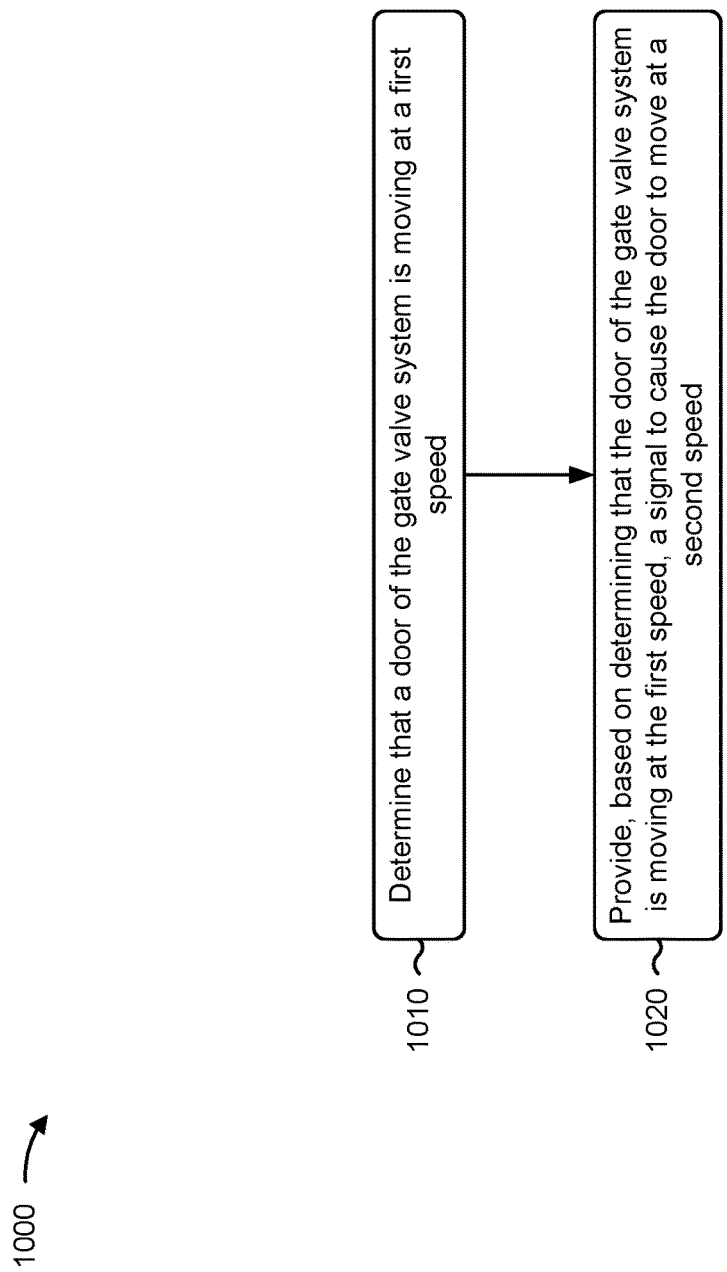
FIGS. 10 and 11 are flowcharts of example processes associated with operating a gate valve control system described herein.

FIG. 10 is a flowchart of an example process 1000 associated with operating a gate valve control system described herein. In some implementations, one or more process blocks of FIG. 10 are performed by a controller (e.g., the controller 234, the device 900). In some implementations, one or more process blocks of FIG. 10 are performed by another device or a group of devices separate from or including the controller, such as a proportional valve (e.g., the proportional valve 608), a flowmeter (e.g., the flowmeter 606), a solenoid valve (e.g., the solenoid valve 612, the solenoid valve 616), a pressure sensor (e.g., the pressure sensor 620), another component included in the gate valve control system 318, and/or another component included in the lithography system 100, among other examples. Additionally, or alternatively, one or more process blocks of FIG. 10 may be performed by one or more components of the device 900, such as processor 920, memory 930, input component 940, output component 950, and/or communication component 960.

As shown in FIG. 10, process 1000 may include determining that a door of a gate valve system is moving at a first speed (block 1010). For example, the controller 234 may determine that a door (e.g., the door 228, the door 230, the door 232, and/or the door 306) of a gate valve system 300 is moving at a first speed, as described above. In some implementations, the controller is included in a gate valve control system 318 of the gate valve system 300. In some implementations, the gate valve system 300 is included in an EUV lithography system (e.g., the lithography system 100).

As further shown in FIG. 10, process 1000 may include providing a signal to cause the door to move at a second speed, wherein the second speed is different than the first speed (block 1020). For example, the controller 234 may provide a signal to cause the door to move at a second speed, as described above. In some implementations, the second speed is different than the first speed.

Process 1000 may include additional implementations, such as any single implementation or any combination of implementations described below and/or in connection with one or more other processes described elsewhere herein.

In a first implementation, process 1000 includes receiving sensor data from a pressure sensor 620 included in the gate valve control system 318, where determining that the door of the gate valve system 300 is moving at the first speed includes determining, based on the sensor data, that the door of the gate valve system 300 is moving at the first speed. In a second implementation, alone or in combination with the first implementation, providing the signal includes providing, to a solenoid valve 612 included in the gate valve control system 318, the signal to cause the solenoid valve 612 to remove a portion of a gas in a gas tank 614 included in the gate valve control system 318, where the solenoid valve 612 removing the portion of the gas in the gas tank 614 reduces a back pressure 702 on a gate valve cylinder 504 associated with the door of the gate valve system 300, and where reducing the back pressure 702 on the gate valve cylinder 504 causes the door to move at the second speed.

In a third implementation, alone or in combination with one or more of the first and second implementations, process 1000 includes providing, to another solenoid valve 616 included in the gate valve control system 318, a second signal to cause the other solenoid valve 616 to exhaust at least a portion, of the portion of the gas that was removed from the gas tank 614 by the solenoid valve 612, from the gate valve control system 318, where the other solenoid valve 616 exhausting the portion of the gas in the gas tank 614 further reduces the back pressure 702 on the gate valve cylinder 504, further reducing the back pressure 702 on the gate valve cylinder 504 causes the door to move at third speed, and where the third speed is different than the second speed.

In a fourth implementation, alone or in combination with one or more of the first through third implementations, process 1000 includes determining that a rate of change of a back pressure 702, on a gate valve cylinder 504 associated with the door of the gate valve system 300, satisfies a rate threshold, and determining, based on determining that the rate of change of the back pressure 702 satisfies the rate threshold, that movement of the door has started. In a fifth implementation, alone or in combination with one or more of the first through fourth implementations, process 1000 includes monitoring, based on determining that the movement of the door has started, the back pressure 702 relative to a back pressure threshold, and determining, based on monitoring the back pressure 702 relative to the back pressure threshold, that the back pressure satisfies the back pressure threshold, where determining that the door of the gate valve system 300 is moving at the first speed includes determining, based on determining that the back pressure 702 satisfies the back pressure threshold, that the door of the gate valve system 300 is moving at the first speed.

In a sixth implementation, alone or in combination with one or more of the first through fifth implementations, providing the signal to cause the door to move at the second speed includes providing the signal to cause a rate of increase, of a back pressure 702, on a gate valve cylinder 504 associated with the door of the gate valve system 300, to be reduced.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Figure 11:
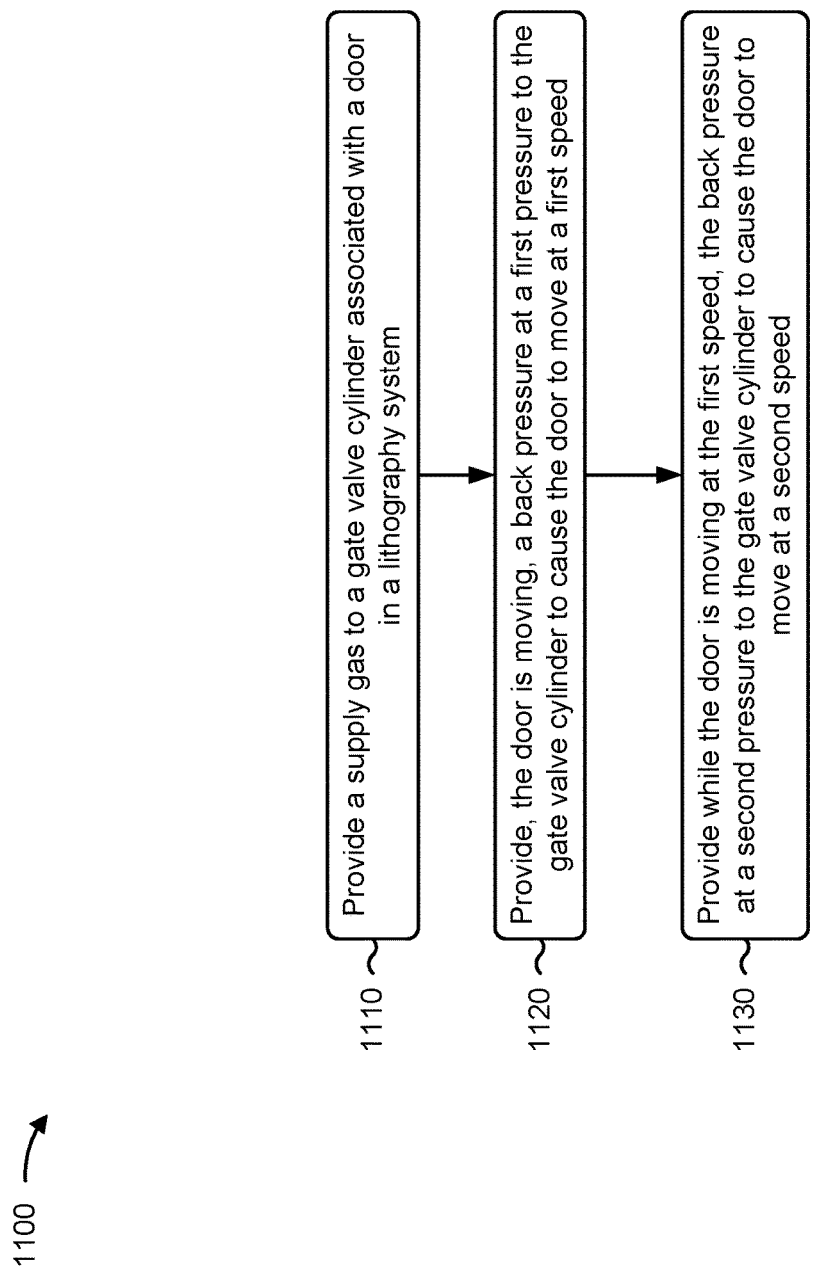

FIG. 11 is a flowchart of an example process 1100 associated with operating a gate valve control system described herein. In some implementations, one or more process blocks of FIG. 11 are performed by a gate valve control system (e.g., the gate valve control system 318). In some implementations, one or more process blocks of FIG. 11 are performed by another device or a group of devices separate from or including the gate valve control system 318, such as a controller (e.g., the controller 234), a proportional valve (e.g., the proportional valve 608), a flowmeter (e.g., the flowmeter 606), a solenoid valve (e.g., the solenoid valve 612, the solenoid valve 616), a pressure sensor (e.g., the pressure sensor 620), another component included in the gate valve control system 318, and/or another component included in the lithography system 100, among other examples. Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include providing a supply gas to a gate valve cylinder associated with a door in a lithography system (block 1110). For example, the gate valve control system 318 may provide a supply gas 512 to a gate valve cylinder 504 associated with a door (e.g., the door 228, the door 230, the door 232, and/or the door 306) in a lithography system 100, as described above. In some implementations, the supply gas 512 is provided to the gate valve cylinder 504 to cause the door to move.

As further shown in FIG. 11, process 1100 may include providing a back pressure at a first pressure to the gate valve cylinder to cause the door to move at a first speed (block 1120). For example, the gate valve control system 318 may provide a back pressure 702 at a first pressure to the gate valve cylinder 504 to cause the door to move at a first speed, as described above.

As further shown in FIG. 11, process 1100 may include providing the back pressure at a second pressure to the gate valve cylinder to cause the door to move at a second speed (block 1130). For example, the gate valve control system 318 may provide the back pressure 702 at a second pressure to the gate valve cylinder 504 to cause the door to move at a second speed, as described above. In some implementations, the second speed is different than the first speed.

Process 1100 may include additional implementations, such as any single implementation or any combination of implementations described below and/or in connection with one or more other processes described elsewhere herein.

In a first implementation, providing the back pressure 702 at the first pressure includes providing the back pressure 702 at the first pressure along a first movement distance of the door, and providing the back pressure 702 at the second pressure includes providing the back pressure 702 at the second pressure along a second movement distance of the door after the first movement distance. In a second implementation, alone or in combination with the first implementation, process 1100 includes receiving the supply gas 512 from a facility gas supply inlet 602, and providing a portion of the supply gas 512 to a gas tank 614 included in the gate valve control system 318, where providing the back pressure 702 at the first pressure includes providing, using the portion of the supply gas 512 in the gas tank 614, the back pressure 702 at the first pressure.

In a third implementation, alone or in combination with one or more of the first and second implementations, providing the portion of the supply gas 512 to the gas tank 614 includes providing the portion of the supply gas 512 to the gas tank 614 through a proportional valve 608, through a one-way valve 610, and through a solenoid valve 612. In a fourth implementation, alone or in combination with one or more of the first through third implementations, providing the back pressure 702 at the first pressure includes providing the back pressure 702 at the first pressure using a solenoid valve 612 included in the gate valve control system 318 and a gas tank 614 included in the gate valve control system 318.

In a fifth implementation, alone or in combination with one or more of the first through fourth implementations, providing the back pressure 702 at the second pressure includes providing the back pressure 702 at the second pressure using the solenoid valve 612, the gas tank 614, and another solenoid valve 616 included in the gate valve control system 318. In a sixth implementation, alone or in combination with one or more of the first through fifth implementations, the second pressure is less than the first pressure.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, the variable speed operation of one or more components in the lithography system described herein may reduce friction between the contact parts and/or may reduce forces applied to the contact parts, which reduces the likelihood of particle generation in the lithography system. Example implementations described herein may reduce wearing and wafer particle fall-on (e.g., from approximately 1.5 average particles to approximately 0.5 average particles per semiconductor substrate or fewer), which reduces semiconductor substrate defects on the semiconductor substrate, reduces semiconductor device failures on the semiconductor substrate, and/or increases semiconductor yield for the semiconductor substrate, among other examples. Moreover, example implementations described herein may reduce the cleaning frequency (e.g., may increase the time duration between cleaning operations) of components in one or more paths of transfer of semiconductor substrates in the lithography system (e.g., by 50% or more), which increases the available time (e.g., the time duration that the lithography system is in production operation) and throughput of the lithography system. In addition, example implementations described herein may reduce the replacement frequency (e.g., may increase the time duration between component replacement) of components in one or more paths of transfer of semiconductor substrates in the lithography systems (e.g., from approximately 5 weeks between component replacement to approximately 12 weeks or greater between component replacement), which reduces the complexity and cost of maintaining the lithography system.

As described in greater detail above, some implementations described herein provide a method. The method includes determining, by a controller included in a gate valve control system of a gate valve system, that a door of the gate valve system is moving at a first speed, where the gate valve system is included in an EUV lithography system. The method includes providing, by the controller based on determining that the door of the gate valve system is moving at the first speed, a signal to cause the door to move at a second speed, where the second speed is different than the first speed.

As described in greater detail above, some implementations described herein provide a method. The method includes providing, by a gate valve control system of a gate valve system, a supply gas to a gate valve cylinder associated with a door in a lithography system, where the supply gas is provided to the gate valve cylinder to cause the door to move. The method includes providing, by the gate valve control system while the door is moving, a back pressure at a first pressure to the gate valve cylinder to cause the door to move at a first speed. The method includes providing, by the gate valve control system while the door is moving at the first speed, the back pressure at a second pressure to the gate valve cylinder to cause the door to move at a second speed, where the second speed is different than the first speed.

As described in greater detail above, some implementations described herein provide a gate valve control system of a gate valve system. The gate valve control system of gate valve system includes a two-way valve configured, provide a first portion of a supply gas to a gate valve cylinder of the gate valve system to cause a door of the gate valve system to move, and receive an exhaust gas from the gate valve cylinder. The gate valve control system of gate valve system includes a gas tank configured, store a second portion of the supply gas, receive the exhaust gas from the two-way valve, and provide, using the second portion of the supply gas, a back pressure on the exhaust gas from the two-way valve. The gate valve control system of gate valve system includes a plurality of solenoid valves configured to adjust the back pressure on the exhaust gas to provide variable speed control for movement of the door of the gate valve system.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
determining, by a controller included in a gate valve control system of a gate valve system, that a door of the gate valve system is moving at a first speed,
wherein the gate valve system is included in an extreme ultraviolet (EUV) lithography system, and
providing, by the controller based on determining that the door of the gate valve system is moving at the first speed, a signal to cause the door to move at a second speed,
wherein the second speed is different than the first speed; and
wherein providing the signal to cause the door to move at the second speed comprises:
providing the signal to cause a rate of increase, of a back pressure, on a gate valve cylinder associated with the door of the gate valve system, to be reduced.

2. The method of claim 1, further comprising:
determining that a rate of change of the back pressure on the gate valve cylinder satisfies a rate threshold; and
determining, based on determining that the rate of change of the back pressure on the gate valve cylinder satisfies the rate threshold, that movement of the door has started.

3. The method of claim 2, further comprising:
monitoring, based on determining that the movement of the door has started, the back pressure on the gate valve cylinder relative to a back pressure threshold; and
determining, based on monitoring the back pressure on the gate valve cylinder relative to the back pressure threshold, that the back pressure on the gate valve cylinder satisfies the back pressure threshold,
wherein determining that the door of the gate valve system is moving at the first speed comprises:
determining, based on determining that the back pressure on the gate valve cylinder satisfies the back pressure threshold, that the door of the gate valve system is moving at the first speed.

4. The method of claim 1, further comprising:
determining that a magnitude of the back pressure on the gate valve cylinder satisfies a magnitude threshold; and
determining, based on determining that the magnitude of the back pressure on the gate valve cylinder satisfies the magnitude threshold, that movement of the door has started.

5. The method of claim 1, wherein providing the signal comprises:
providing, to a solenoid valve included in the gate valve control system, the signal to cause the solenoid valve to remove a portion of a gas in a gas tank included in the gate valve control system.

6. The method of claim 5, further comprising:
providing, to another solenoid valve included in the gate valve control system, another signal to cause the other solenoid valve to exhaust at least a portion, of the portion of the gas that was removed from the gas tank by the solenoid valve, from the gate valve control system.

7. The method of claim 1, further comprising:
determining that the door is approaching a door frame or a separation plate of the gate valve control system; and
wherein providing the signal comprises:
providing the signal based on determining that the door is approaching the door frame or the separation plate.

8. A method, comprising:
providing, by a gate valve control system of a gate valve system, a first portion of a supply gas to a gate valve cylinder associated with a door in a lithography system, wherein the first portion of the supply gas is provided to the gate valve cylinder to cause the door to move;
providing, by the gate valve control system, a second portion of the supply gas to a gas tank through a proportional valve, a one-way valve, and a solenoid valve;
providing, by the gate valve control system while the door is moving and using the second portion of the supply gas in the gas tank, a back pressure at a first pressure to the gate valve cylinder to cause the door to move at a first speed; and
providing, by the gate valve control system while the door is moving at the first speed, the back pressure at a second pressure to the gate valve cylinder to cause the door to move at a second speed,
wherein the second speed is different than the first speed.

9. The method of claim 8, further comprising:
receiving the supply gas from a facility gas supply inlet.

10. The method of claim 8, further comprising:
determining that the door is approaching a door frame or a separation plate of the gate valve control system; and
wherein providing the back pressure at the second pressure to the gate valve cylinder comprises:
providing the back pressure at the second pressure to the gate valve cylinder based on determining that the door is approaching the door frame or the separation plate.

11. The method of claim 8, wherein providing the back pressure at the first pressure comprises:
providing the back pressure at the first pressure along a first movement distance of the door; and
wherein providing the back pressure at the second pressure comprises:
providing the back pressure at the second pressure along a second movement distance of the door after the first movement distance.

12. The method of claim 8, wherein providing the back pressure at the second pressure comprises:
providing, to the solenoid valve, a signal to cause the solenoid valve to exhaust or remove a portion of the supply gas from the gas tank.

13. The method of claim 8, further comprising:
monitoring the back pressure on the gate valve cylinder relative to a back pressure threshold; and
determining, based on monitoring the back pressure on the gate valve cylinder relative to the back pressure threshold, that the door is moving at the first speed across a first movement distance of the door.

14. The method of claim 13, further comprising:
determining, based on the door moving at the first speed across the first movement distance, that the door is approaching a door frame or a separation plate of the gate valve control system; and
wherein providing the back pressure at the second pressure to the gate valve cylinder comprises:
providing the back pressure at the second pressure to the gate valve cylinder based on determining that the door is approaching the door frame or the separation plate.

15. A gate valve control system of a gate valve system, comprising:
a two-way valve configured to:
provide a first portion of a supply gas to a gate valve cylinder of the gate valve system to cause a door of the gate valve system to move;
a gas tank configured to:
store a second portion of the supply gas, and
provide, using the second portion of the supply gas, a back pressure to the two-way valve; and
a solenoid valve configured to adjust the back pressure to provide variable speed control for movement of the door.

16. The gate valve control system of claim 15, wherein the solenoid valve, to adjust the back pressure, is configured to:
remove or exhaust at least a partial amount of the supply gas stored in the gas tank.

17. The gate valve control system of claim 16, further comprising:
a controller configured to provide one or more signals to the solenoid valve to cause the solenoid valve to remove or exhaust the at least the partial amount of the supply gas stored in the gas tank.

18. The gate valve control system of claim 15, further comprising:
another solenoid valve configured to adjust the back pressure.

19. The gate valve control system of claim 18, wherein the other solenoid valve, to adjust the back pressure, is configured to:
remove or exhaust at least a partial amount of the supply gas removed from the gas tank by the solenoid valve.

20. The gate valve control system of claim 15, further comprising:
a pressure sensor configured to generate sensor data based on the back pressure.

* * * * *